United States Patent
Chang et al.

(10) Patent No.: US 10,923,465 B2
(45) Date of Patent: Feb. 16, 2021

(54) SEMICONDUCTOR DEVICE HAVING STACKED SEMICONDUCTOR CHIPS AND METHOD FOR FABRICATING THE SAME

(71) Applicant: SAMSUNG ELECTRONICS CO., LTD., Suwon-si (KR)

(72) Inventors: Won-Gi Chang, Hwaseong-si (KR); Dongwon Lee, Anyang-si (KR); Myung-Sung Kang, Yongin-si (KR); Hyein Yoo, Pyeongtaek-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/417,934

(22) Filed: May 21, 2019

(65) Prior Publication Data
US 2019/0273075 A1 Sep. 5, 2019

Related U.S. Application Data

(63) Continuation of application No. 15/438,184, filed on Feb. 21, 2017, now Pat. No. 10,354,985.

(30) Foreign Application Priority Data

Jun. 15, 2016 (KR) .......................... 10-2016-0074740

(51) Int. Cl.
*H01L 25/00* (2006.01)
*H01L 21/683* (2006.01)
(Continued)

(52) U.S. Cl.
CPC ............ *H01L 25/50* (2013.01); *H01L 21/561* (2013.01); *H01L 21/563* (2013.01);
(Continued)

(58) Field of Classification Search
CPC ..... H01L 25/50; H01L 25/0657; H01L 21/78; H01L 21/565
See application file for complete search history.

(56) References Cited

U.S. PATENT DOCUMENTS

| 6,853,089 B2 | 2/2005 | Ujiie et al. |
| 8,637,969 B2 | 1/2014 | Lee et al. |
| (Continued) | | |

FOREIGN PATENT DOCUMENTS

| CN | 102446863 | 5/2012 |
| CN | 104576621 | 4/2015 |
| (Continued) | | |

OTHER PUBLICATIONS

M. Stafe et al., Pulsed Laser Ablation of Solids: Basics, Theory and Applications, Spring Series in Surface Sciences 53, Springer Heidelberg New York Dordrecht London, pp. 143-153.

*Primary Examiner* — Kyoung Lee
*Assistant Examiner* — Christina A Sylvia
(74) *Attorney, Agent, or Firm* — F. Chau & Associates, LLC

(57) ABSTRACT

A method for manufacturing a semiconductor device includes stacking, on a package substrate, first semiconductor chips. Each of the first semiconductor chips includes a first adhesive film. The method includes stacking, respectively on the first semiconductor chips, second semiconductor chips. Each of the second semiconductor chips includes a second adhesive film. The method includes compressing the first and second adhesive films to form an adhesive structure. The adhesive structure includes an extension disposed on sidewalls of the first and second semiconductor chips. The method includes removing the extension. The method includes forming a first molding layer substantially covering the first and second semiconductor chips. The method includes performing a cutting process on the pack- (Continued)

age substrate between the first and second semiconductor chips to form a plurality of semiconductor packages each including at least one of the first semiconductor chips and at least one of the second semiconductor chips.

17 Claims, 25 Drawing Sheets

(51) Int. Cl.
    *H01L 21/56*     (2006.01)
    *H01L 23/31*     (2006.01)
    *H01L 23/00*     (2006.01)
    *H01L 21/78*     (2006.01)
    *H01L 25/065*     (2006.01)

(52) U.S. Cl.
    CPC ........ *H01L 21/565* (2013.01); *H01L 21/6835* (2013.01); *H01L 21/78* (2013.01); *H01L 23/3135* (2013.01); *H01L 24/32* (2013.01); *H01L 24/75* (2013.01); *H01L 24/83* (2013.01); *H01L 24/95* (2013.01); *H01L 24/97* (2013.01); *H01L 25/0657* (2013.01); *H01L 24/16* (2013.01); *H01L 24/81* (2013.01); *H01L 2221/68327* (2013.01); *H01L 2224/0557* (2013.01); *H01L 2224/13025* (2013.01); *H01L 2224/13101* (2013.01); *H01L 2224/16145* (2013.01); *H01L 2224/16225* (2013.01); *H01L 2224/32145* (2013.01); *H01L 2224/32225* (2013.01); *H01L 2224/73204* (2013.01); *H01L 2224/7598* (2013.01); *H01L 2224/81001* (2013.01); *H01L 2224/81191* (2013.01); *H01L 2224/81203* (2013.01); *H01L 2224/83191* (2013.01); *H01L 2224/83201* (2013.01); *H01L 2224/83931* (2013.01); *H01L 2224/83947* (2013.01); *H01L 2225/06544* (2013.01); *H01L 2924/1434* (2013.01); *H01L 2924/15311* (2013.01); *H01L 2924/181* (2013.01); *H01L 2924/18161* (2013.01); *H01L 2924/3511* (2013.01)

(56) References Cited

U.S. PATENT DOCUMENTS

| | | | |
|---|---|---|---|
| 8,901,727 B2 * | 12/2014 | Kang | ............... H01L 23/28 257/686 |
| 9,054,228 B2 | 6/2015 | Choi et al. | |
| 9,099,456 B2 | 8/2015 | Han | |
| 9,165,916 B2 * | 10/2015 | Chung | ............... H01L 25/50 |
| 9,177,835 B1 | 11/2015 | Chuang et al. | |
| 9,214,410 B2 | 12/2015 | Kim et al. | |
| 10,026,724 B2 | 1/2018 | Kim et al. | |
| 2010/0055916 A1 | 3/2010 | Shih | |
| 2011/0058348 A1 * | 3/2011 | Sakai | ............... H01L 23/50 361/803 |
| 2012/0077314 A1 * | 3/2012 | Park | ............... H01L 23/3107 438/109 |
| 2012/0088332 A1 * | 4/2012 | Lee | ............... H01L 23/3121 438/113 |
| 2012/0252166 A1 | 10/2012 | Koyanagi | |
| 2013/0032947 A1 | 2/2013 | Park et al. | |
| 2013/0082399 A1 * | 4/2013 | Kim | ............... H01L 24/97 257/774 |
| 2013/0318261 A1 | 11/2013 | Cheng | |
| 2014/0013606 A1 * | 1/2014 | Nah | ............... H01L 25/0657 33/566 |
| 2014/0134798 A1 | 5/2014 | Kim et al. | |
| 2014/0295620 A1 | 10/2014 | Ito et al. | |
| 2015/0102468 A1 * | 4/2015 | Kang | ............... H01L 24/92 257/621 |
| 2015/0130030 A1 | 5/2015 | Ma et al. | |
| 2015/0214207 A1 | 7/2015 | Yoshida | |
| 2015/0318255 A1 | 11/2015 | Karhade et al. | |
| 2016/0056101 A1 | 2/2016 | Jee et al. | |
| 2017/0125387 A1 | 5/2017 | Kang et al. | |
| 2017/0365591 A1 | 12/2017 | Chang et al. | |

FOREIGN PATENT DOCUMENTS

| | | | |
|---|---|---|---|
| JP | H11-40624 | 2/1999 | |
| JP | 2003-092311 | 3/2003 | |
| JP | 2005-032820 | 2/2005 | |
| JP | 2007-305714 | 11/2007 | |
| JP | 2009-010201 | 1/2009 | |
| JP | 2013-021058 | 1/2013 | |
| JP | 2013-093568 | 5/2013 | |
| JP | 2014-192171 | 10/2014 | |
| JP | 2015-070539 | 4/2015 | |
| JP | 5793991 | 8/2015 | |
| KR | 10-2011-0001155 | 1/2011 | |
| KR | 10-1109662 | 1/2012 | |
| KR | 1020150093309 | * 6/2015 | ........... H01L 25/065 |
| KR | 10-2015-0125815 | 11/2015 | |
| TW | 201320259 | 5/2013 | |
| TW | 201541541 | 11/2015 | |

* cited by examiner

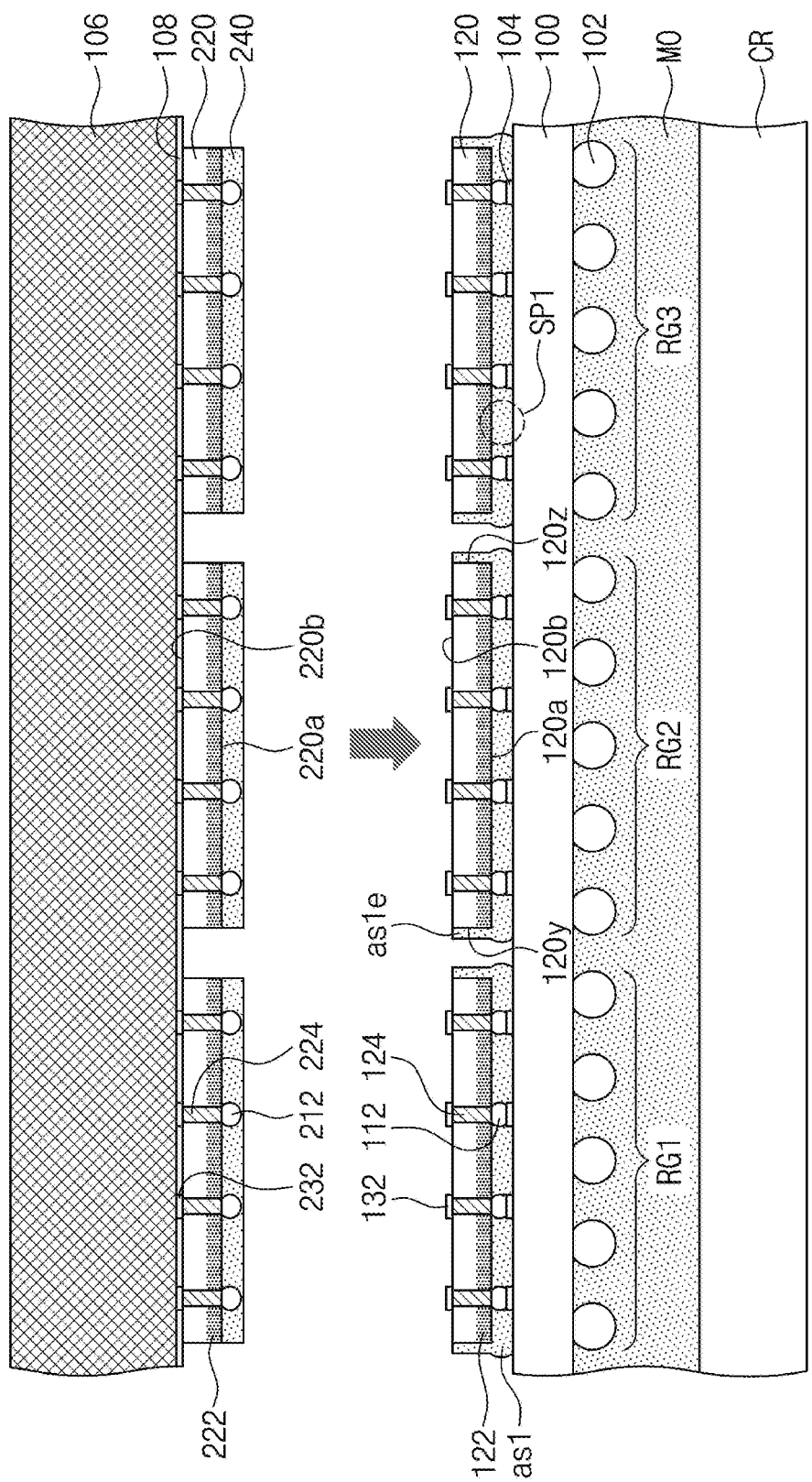

SEMICONDUCTOR DEVICE HAVING STACKED SEMICONDUCTOR CHIPS AND METHOD FOR FABRICATING THE SAME

CROSS-REFERENCE TO RELATED APPLICATIONS

This application is a continuation of U.S. application Ser. No. 15/438,184, filed on Feb. 21, 2017, which claims priority under 35 U.S.C § 119 to Korean Patent Application 10-2016-0074740 filed on Jun. 15, 2016, the disclosures of which are incorporated by reference herein in their entirety.

TECHNICAL FIELD

Exemplary embodiments of the present inventive concept relate to a semiconductor device, and more particularly to a semiconductor device having stacked semiconductor chips and a method for fabricating the same.

DISCUSSION OF RELATED ART

Semiconductor devices may have relatively high capacity, and may be relatively thin and relatively small. One approach of various package techniques is a packaging technique which vertically stacks a plurality of semiconductor chips to form a relatively high density semiconductor chip package. Stacked semiconductor chips having various functions may be integrated in a relatively small area.

SUMMARY

One or more exemplary embodiments of the present inventive concept provide a semiconductor device having relatively high mechanical endurance. A semiconductor device according to one or more exemplary embodiments of the present inventive concept may include an adhesive structure serving as an under-fill.

One or more exemplary embodiments of the present inventive concept provide a method for fabricating a semiconductor device, which may eliminate an extension of an adhesive structure covering stacked semiconductor chips in the semiconductor device.

According to one or more exemplary embodiments of the present inventive concept, a method for manufacturing a semiconductor device includes stacking, on a package substrate, first semiconductor chips horizontally spaced apart from each other. Each of the first semiconductor chips includes a first adhesive film facing the package substrate. The method includes stacking, respectively on the first semiconductor chips, second semiconductor chips horizontally spaced apart from each other. Each of the second semiconductor chips includes a second adhesive film facing the first semiconductor chip. The method includes compressing the first adhesive film and the second adhesive film to form an adhesive structure. The adhesive structure includes an extension disposed on sidewalls of the first semiconductor chip and sidewalls of the second semiconductor chip. The method includes removing the extension from the sidewalls of the second semiconductor chips. The method includes forming a first molding layer substantially covering the first and second semiconductor chips. The method includes performing a cutting process on the package substrate between the first and second semiconductor chips to form a plurality of semiconductor packages each including at least one of the first semiconductor chips and at least one of the second semiconductor chips.

According to one or more exemplary embodiments of the present inventive concept, a method for manufacturing a semiconductor device includes forming, on a package substrate, a plurality of stack structures horizontally spaced apart from each other, each of the stack structures including a plurality of semiconductor chips vertically stacked. The method includes forming adhesive structures respectively filling paces between adjacent stack structures of the plurality of stack structures. The method includes removing a least a portion of the adhesive structure between the adjacent stack structures. Forming the stack structure and the adhesive structures includes sequentially stacking and compressing the plurality of semiconductor chips each including an adhesive film disposed on a surface of the semiconductor chip facing the package substrate.

According to one or more exemplary embodiments of the present inventive concept, a semiconductor device includes a first semiconductor chip stacked on a package substrate and including a first through via. A second semiconductor chip is stacked on the first semiconductor chip and includes a second through via. A first interconnect member is disposed between the package substrate and the first semiconductor chip and electrically connected to the first through via. A second interconnect member is disposed between the first semiconductor chip and the second semiconductor chip and electrically connected to the second through via. A first adhesive layer substantially fills a first space between the package substrate and the first semiconductor chip and substantially covers the first interconnect member. A second adhesive layer substantially fills a second space between the first semiconductor chip and the second semiconductor chip and substantially covers the second interconnect member. At least one of the first and second adhesive layers includes a recessed sidewall that is recessed toward one of the first and second interconnect members.

BRIEF DESCRIPTION OF THE DRAWINGS

The above and other features of the inventive concept will become more apparent by describing in detail exemplary embodiments thereof, with reference to the accompanying drawings, in which:

FIGS. 1, 2, 4, and 6 to 13 are cross-sectional views illustrating a method for fabricating a semiconductor device according to some exemplary embodiments of the present inventive concept.

DETAILED DESCRIPTION OF THE EMBODIMENTS

FIGS. 1, 2, 4, and 6 to 13 are cross-sectional views illustrating a method for fabricating a semiconductor device according to some exemplary embodiments of the present inventive concept. FIG. 3 is a plan view illustrating a portion of a first semiconductor chip depicted in FIG. 2. FIG. 5A is an enlarged view of section M of FIG. 4. FIG. 5B is a plan view illustrating a portion of a first semiconductor chip depicted in FIG. 4.

Figure 1:
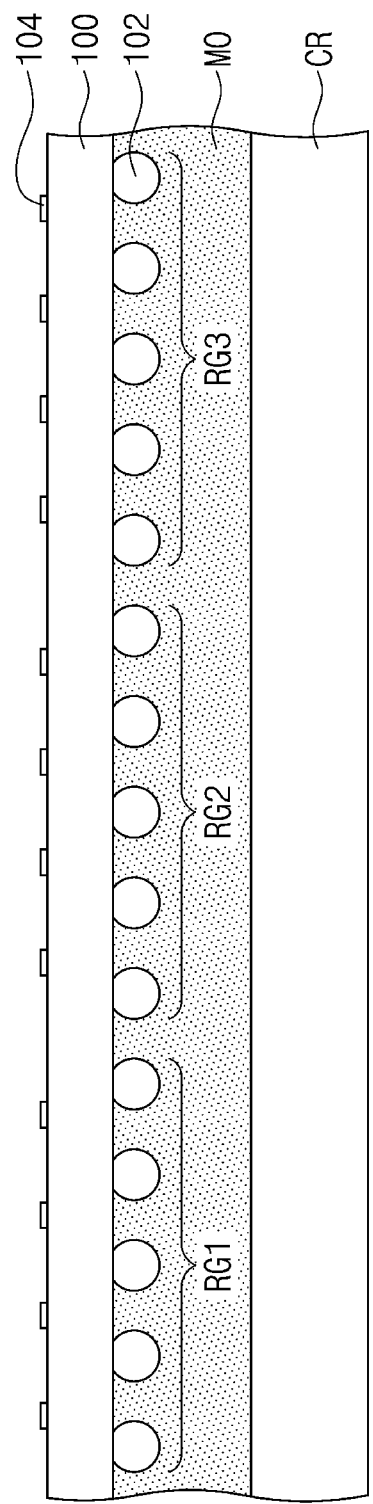

Referring to FIG. 1, a package substrate 100 may be adhered to a carrier substrate CR. For example, the carrier substrate CR and the package substrate 100 may be adhered to each other by an adhesive mold MO disposed between the carrier substrate CR and the package substrate 100. The package substrate 100 may include first to third regions RG1, RG2 and RG3; however, exemplary embodiments of the present inventive concept are not limited thereto. In an exemplary embodiment of the present inventive concept, the package substrate 100 may include regions in addition to the first to third regions RG1, RG2 and RG3. The package substrate 100 may include (e.g., on a bottom surface of the package substrate 100) outer interconnect members 102. For example, the outer interconnect members 102 may be solder balls, which may include tin, lead, or copper. The package substrate 100 may include landing pads 104 on a top surface of the package substrate 100.

As an example, the carrier substrate CR may be a silicon wafer or a glass substrate, and the package substrate 100 may be a printed circuit board (PCB). The package substrate 100 may include one or more through vias through which the outer interconnect members 102 and the landing pads 104 are vertically connected to each other.

Figure 2:
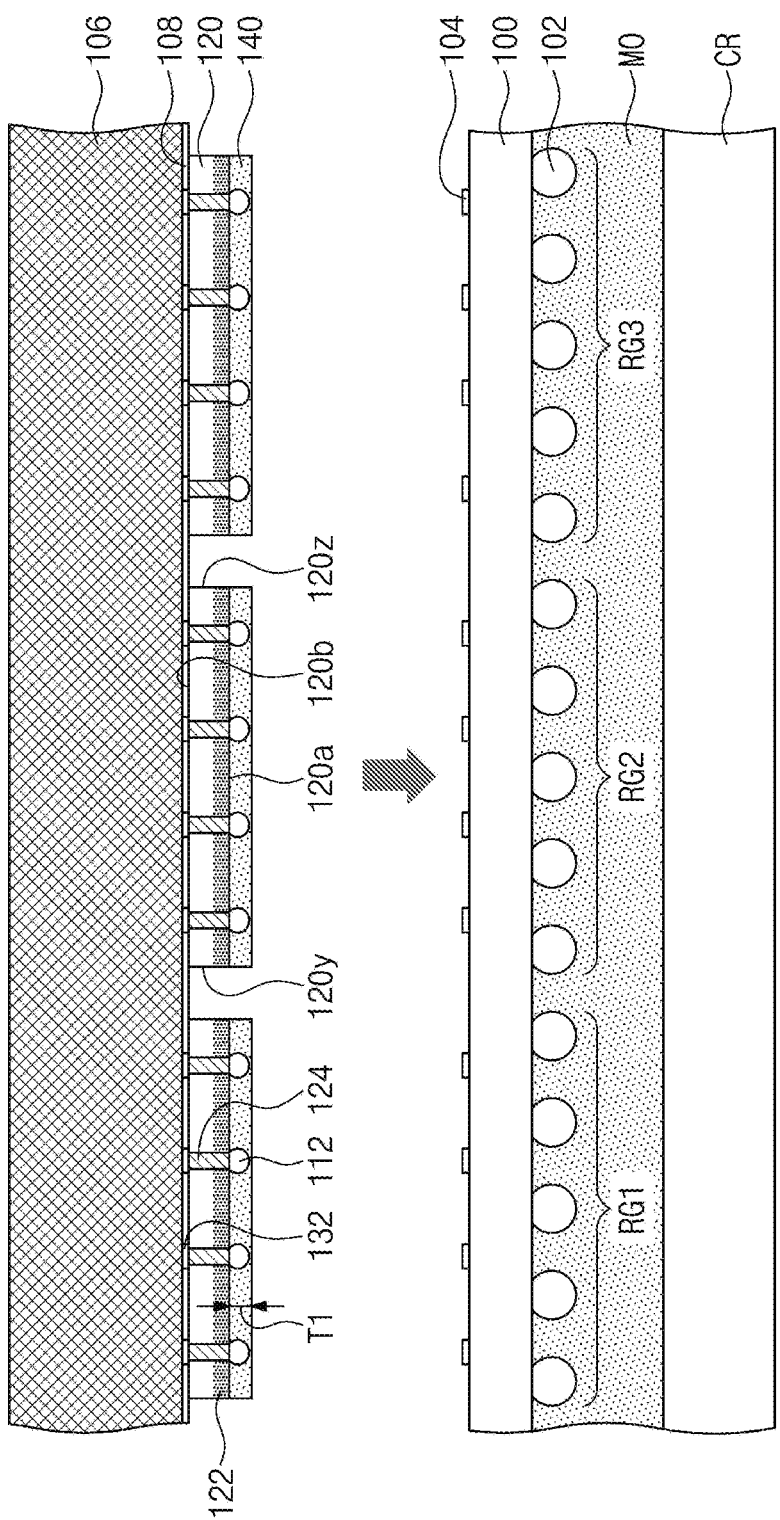
Figure 3:
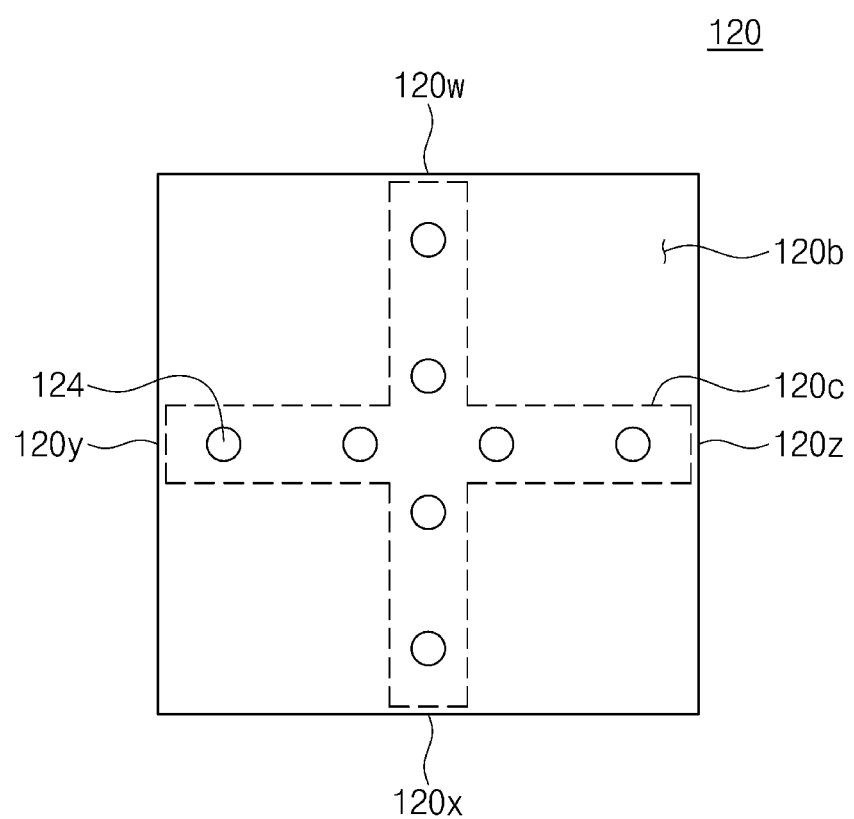
FIG. 3 is a plan view illustrating a portion of a first semiconductor chip depicted in FIG. 2.

Referring to FIG. 2, first semiconductor chips 120 may be respectively positioned in the first to third regions RG1, RG2 and RG3 of the package substrate 100. The first semiconductor chips 120 may be horizontally spaced apart from each other at substantially a same level as each other. Each of the first semiconductor chips 120 may be stacked on the package substrate 100 in a face-down state where a first active surface 120a faces the package substrate 100. As an example, the first semiconductor chips 120 may be substantially simultaneously adhere to the package substrate 100 using a head 106 having a bottom surface loaded with the first semiconductor chips 120. A head film 108 may be disposed between the head 106 and the first semiconductor chips 120. For example, the head film 108 may include a release film that can facilitate detachment the first semiconductor chips 120 from the head 106. The first semiconductor chips 120 may each be substantially a same type of chip. As an example, the first semiconductor chips 120 may each have substantially the same size and may perform substantially the same functions.

A single first semiconductor chip 120 will be described in more detail below with reference to FIG. 3. Referring to FIGS. 2 and 3, the first semiconductor chip 120 may include the first active surface 120a on which a first circuit layer 122 may be disposed and a first inactive surface 120b opposite the first active surface 120a. For example, the first semiconductor chip 120 may be a memory chip. The first semiconductor chip 120 may include through vias 124 electrically connected to the first circuit layer 122. For example, at least one of the first through vias 124 may be a through silicon via (TSV). The first through vias 124 may be disposed in a central region 120c of the first semiconductor chip 120. In an exemplary embodiment of the present inventive concept, the central region 120c may have a cross shape. In the first circuit layer 122, the central region 120c may be a peripheral circuit region and other regions except the central region 120c may be memory cell regions.

The first semiconductor chip 120 may include first to fourth sidewalk 120y, 120z, 120w and 120x. The first and second sidewalls 120y and 120z may face each other, and the third and fourth sidewalls 120w and 120x may face each other. A distance between the first and second sidewalls 120y and 120z may be a width in a first direction of the first semiconductor chip 120, and a distance between the third and fourth sidewalk 120w and 120x may be a width in a second direction crossing the first direction of the first semiconductor chip 120. The width in the first direction may be substantially the same as the width in the second direction crossing the first direction; however, exemplary embodiments of the present inventive concept are not limited thereto, and the widths may be different from each other.

First interconnect members 112, such as solder balls or solder bumps, may be disposed on the first active surface 120a of the first semiconductor chip 120. The first semiconductor chip 120 may be electrically connected to the package substrate 100 through the first interconnect members 112. First backside pads 132 may be disposed on the first inactive surface 120b of the first semiconductor chip 120. The first backside pads 132 may be electrically connected to the first through vias 124. For example, the first interconnect members 112 and the first backside pads 132 may be vertically connected to each other through the first through vias 124.

A first non-conductive film 140 may be adhered to the first active surface 120a of the first semiconductor chip 120. The first non-conductive film 140 may be an epoxy-based adhesive film including no conductive particles. For example, the first non-conductive film 140 may be cured at a temperature of about 100° C. of higher. The first non-conductive film 140 may have a first thickness T1. The first thickness T1 may be substantially the same as or greater than a protruding length of the first interconnect members 112. As an example, the first non-conductive film 140 may cover the first interconnect members 112 and substantially completely fill a space between the first interconnect members 112. The first non-conductive film 140 might not be electrically conductive.

Figure 4:
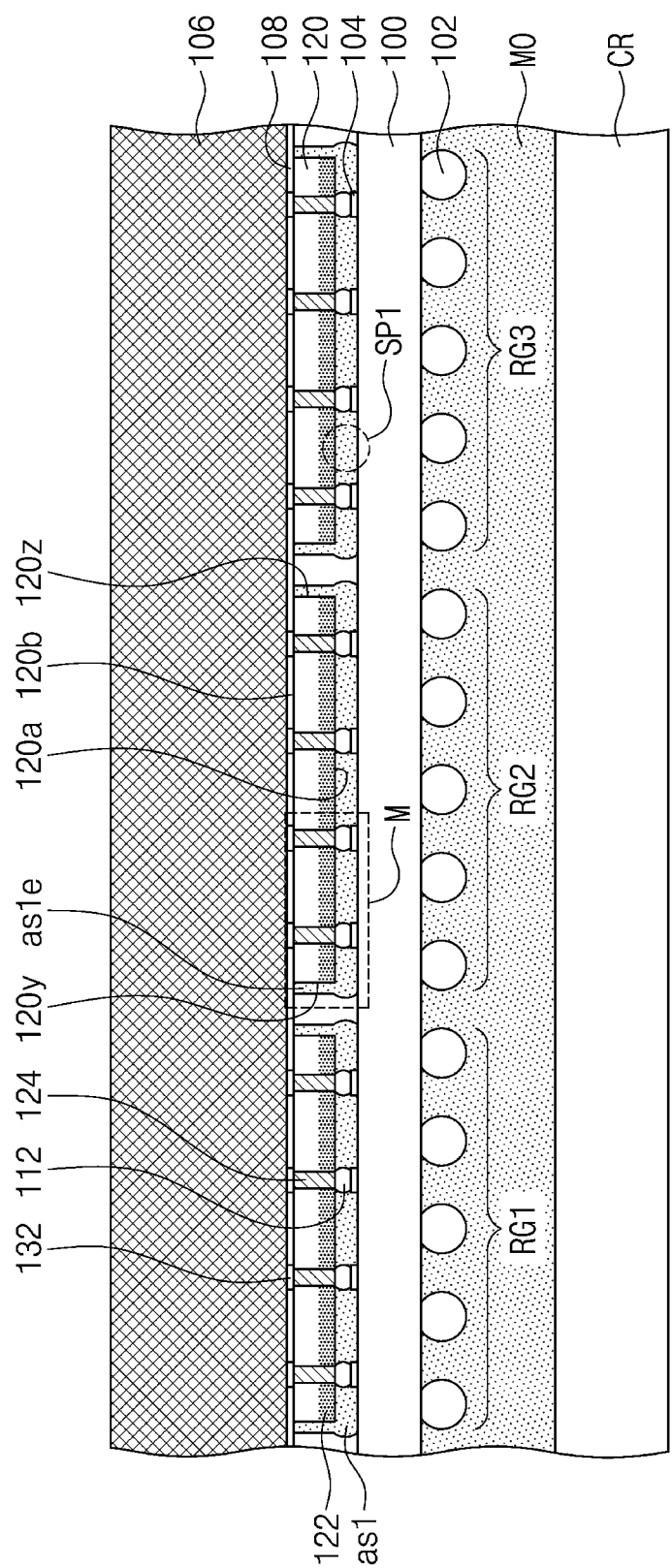
Figure 5A:
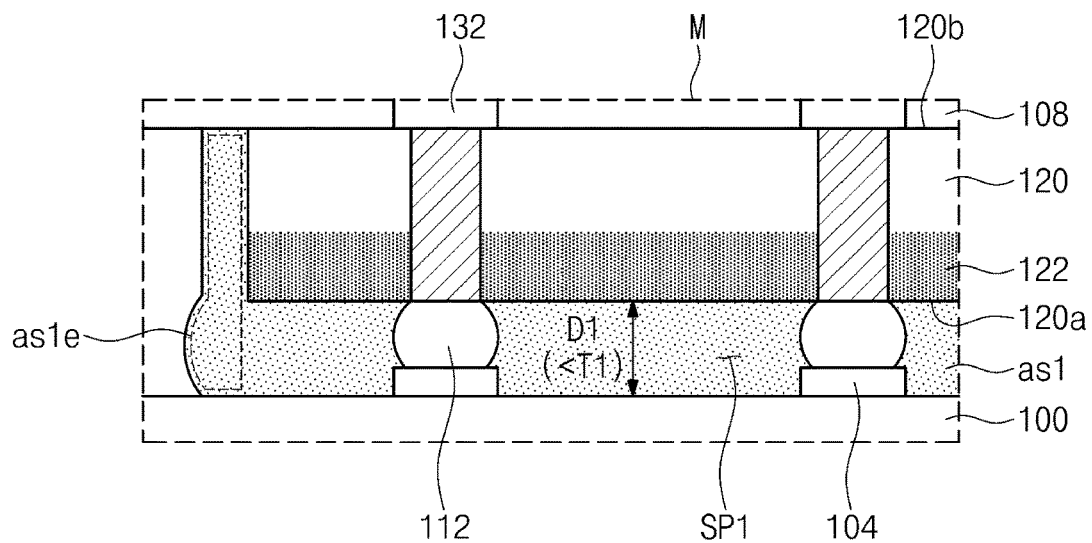
FIG. 5A is an enlarged view of section M of FIG. 4.
Figure 5B:
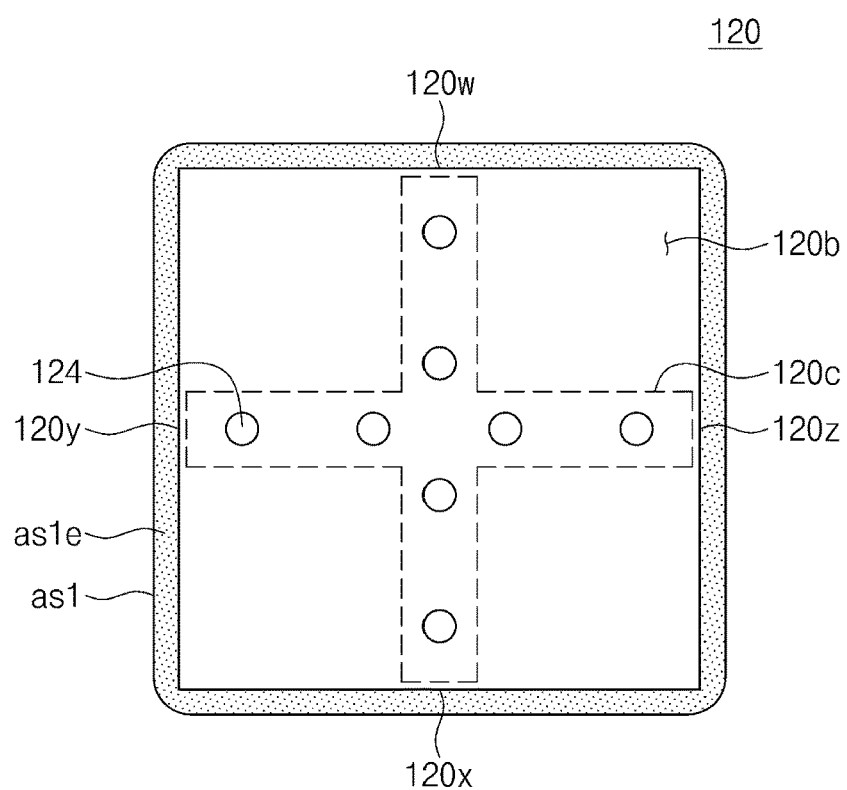
FIG. 5B is a plan view illustrating a portion of a first semiconductor chip depicted in FIG. 4.

Referring to FIGS. 4, 5A and 5B, the first semiconductor chips 120 stacked on the package substrate 100 may be compressed to form first adhesive layers as1 respectively on the first to third regions RG1, RG2 and RG3. The first semiconductor chips 120 may be compressed such that the first interconnect members 112 may respectively contact substantially an entire upper surface of a respective one of the landing pads 104 of the package substrate 100. Thus, the package substrate 100 and the first semiconductor chips 120 may be electrically connected to each other.

The first semiconductor chips 120 may be compressed at substantially the same time when the first semiconductor chips 120 are stacked on the package substrate 100. The compression of the first semiconductor chips 120 may include performing a thermocompression where heat and pressure are applied to the first semiconductor chips 120 and the first non-conductive films 140. As an example, the first semiconductor chip 120 may receive pressure from the head 106 at a temperature greater than the cure temperature of the first non-conductive films 140. For example, the thermocompression may include applying force of from about 10N to about 100N against the first semiconductor chips 120 at a temperature of from about 80° C. to about 300° C.

The first non-conductive films 140 may be compressed to respectively form the first adhesive layers as1. Each of the first adhesive layers as1 may fill a first space SP1 between the first semiconductor chip 120 and the package substrate 100. The first adhesive layers as1 may include a first sub-extension as1e covering the first to fourth sidewalls 120y, 120z, 120w and 120x of the first semiconductor chip 120.

As an example, after the thermocompression, a first distance D1 may be achieved between the first active surface 120a of the first semiconductor chip 120 and the top surface of the package substrate 100, and the first distance D1 may be less than the first thickness T1 of the first non-conductive film 140. As an example, the thermocompression may reduce the thickness of the first non-conductive film 140 so that a fillet may protrude outside the first semiconductor chip 120 from the first non-conductive film 140. The protruded fillet may be cured to form the first sub-extension as1e. The first sub-extension axle may vertically extend along the first to fourth sidewalk 120y, 120z, 120w and 120x and contact the head film 108. The head film 108 may prevent the first sub-extension as1e from covering the first inactive surface 120b of the first semiconductor chip 120.

Referring to FIG. 6, second semiconductor chips 220 may be stacked respectively on the first semiconductor chips 120. Each of the second semiconductor chips 220 may include a second active surface 220a on which a second circuit layer 222 is formed and a second inactive surface 220b opposite the second active surface 220a. The second semiconductor chip 220 may include second through vias 224 penetrating through the second semiconductor chip 220 that are electrically connected to the second circuit layer 222, second interconnect members 212 on the second active surface 220a, and second backside pads 232 on the second inactive surface 220b. For example, the second semiconductor chips 220 may be substantially the same chips as the first semiconductor chips 120 described in more detail above. Thus, duplicative descriptions may be omitted.

A second non-conductive film 240 may be adhered onto the second active surface 220a of each of the second semiconductor chips 220. The second non-conductive film 240 may be an epoxy-based adhesive film including no conductive particles, and may be substantially the same film as the first non-conductive film 140 discussed in more detail above. The second non-conductive film 240 might not be electrically conductive.

Each of the second semiconductor chips 220 may be stacked on the first semiconductor chip 120 in a face-down state where the second active surface 220a faces the first semiconductor chip 120. As an example, the second semiconductor chips 220 may be substantially simultaneously stacked on the first semiconductor chips 120 using the head 106 whose floor surface is loaded with the second semiconductor chips 220. The second semiconductor chips 220 may be horizontally spaced apart from each other at substantially the same level.

Figure 7:
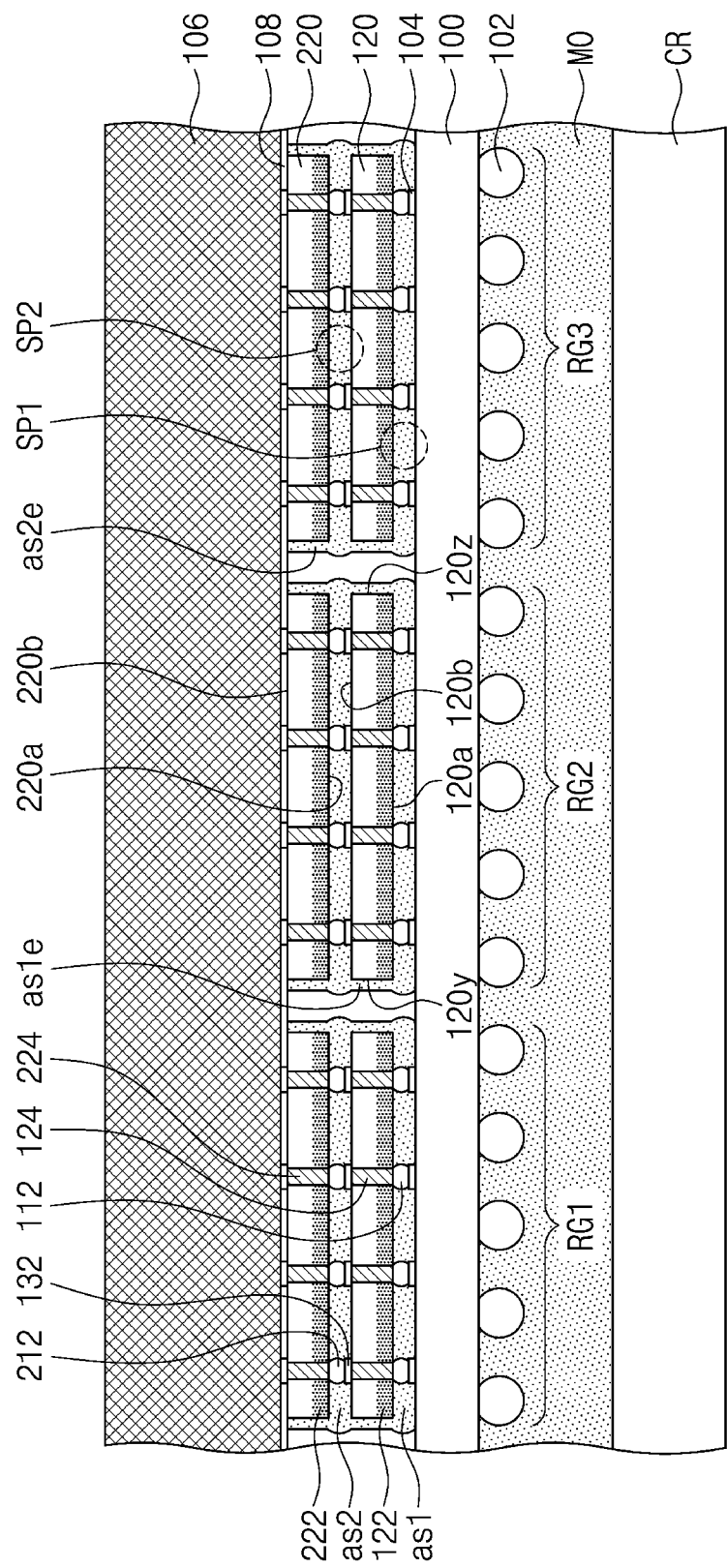

Referring to FIG. 7, the second semiconductor chips 220 on the first semiconductor chips 120 may be compressed to form second adhesive layers as2 respectively on the first to third regions RG1, RG2 and RG3. The second semiconductor chips 220 may be compressed such that the second interconnect members 212 may respectively contact substantially an entire upper surface of a respective one of the first backside pads 132 of the first semiconductor chips 120. Thus, the first semiconductor chips 120 and the second semiconductor chips 220 may be electrically connected to each other.

The second semiconductor chips 220 may be compressed at substantially the same time when the second semiconductor chips 220 are stacked on the first semiconductor chips 120. The compression of the second semiconductor chips 220 may include performing a thermocompression. The compression of the second semiconductor chips 220 may be substantially the same as the compression of the first semiconductor chips 120.

Each of the second adhesive layers as2 may fill a second space SP2 between the first semiconductor chip 120 and the second semiconductor chip 220. The second adhesive layer as2 may include a second sub-extension as2e covering sidewalls of the second semiconductor chip 220. The second sub-extension as2e may be a cured fillet that protrudes outside the second semiconductor chip 220 from the second non-conductive film 240 when the second semiconductor chip 220 is compressed. The first adhesive layer as1 and the second adhesive layer as2 may be integrally connected to each other.

Figure 8:
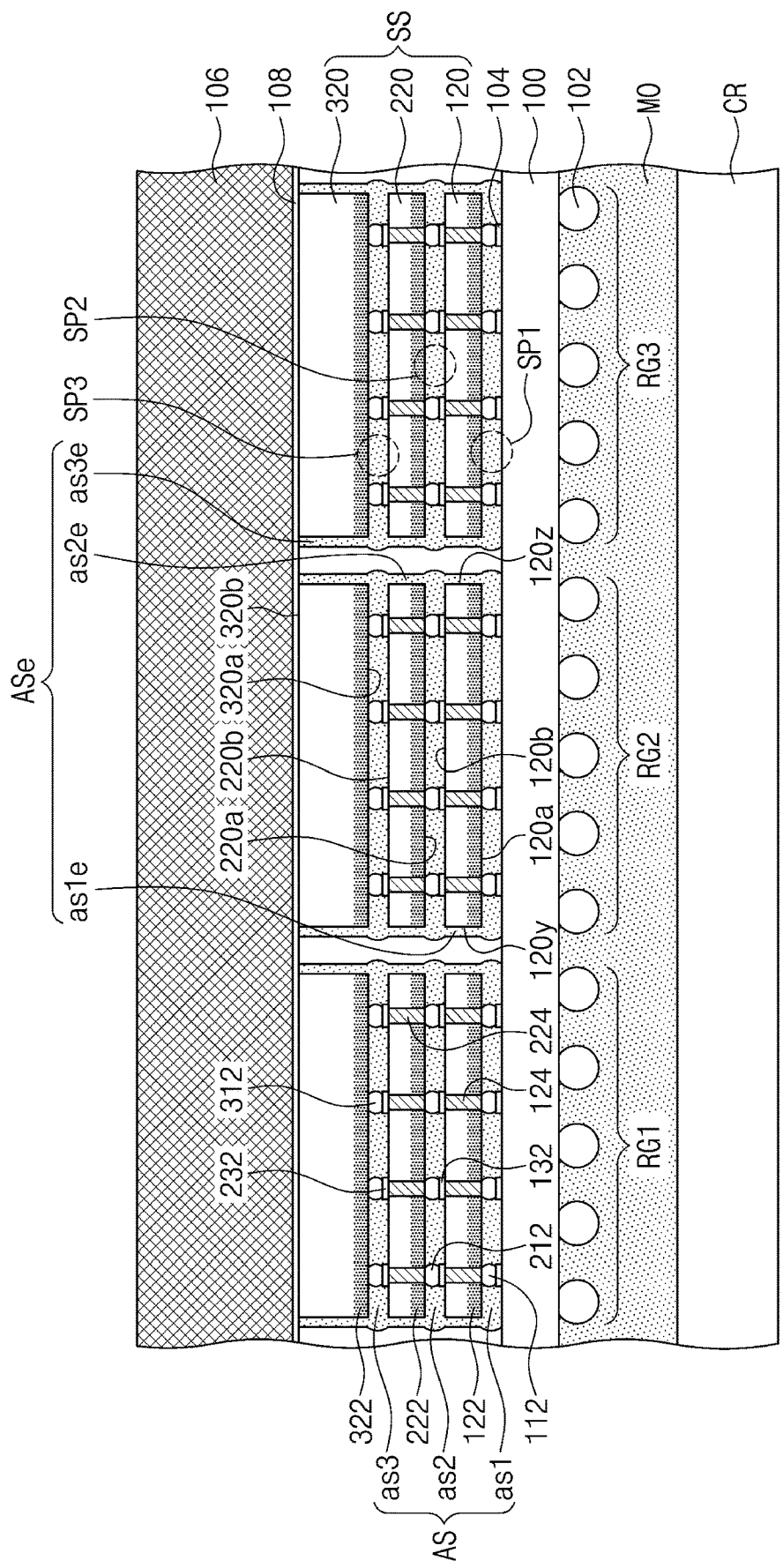

Referring to FIG. 8, third semiconductor chips 320 may be stacked respectively on the second semiconductor chips 220. Each of the third semiconductor chips 320 may include a third active surface 320a on which a third circuit layer 322 is formed and a third inactive surface 320b opposite the third active surface 320a. The third semiconductor chip 320 may include third interconnect members 312 on the third active surface 320a. The third interconnect members 312 need not be vertically aligned with the second through vias 224. In an exemplary embodiment of the present inventive concept, the third semiconductor chip 320 might not include through vias; however, exemplary embodiments of the present inventive concept are not limited thereto. Each of the third semiconductor chips 320 may be a memory chip. For example, the third semiconductor chips 320 may each have a thickness greater than those of the first and second semiconductor chips 120 and 220.

A third non-conductive film may be adhered onto the third active surface 320a of each of the third semiconductor chips 320. The third non-conductive film may be an epoxy-based adhesive film including no conductive particles, and may be substantially the same film as the first non-conductive film 140 discussed in more detail above. The third non-conductive film might not be electrically conductive.

Each of the third semiconductor chips 320 may be stacked on the second semiconductor chip 220 in a face-down state where the third active surface 320a faces the second semiconductor chip 220. As an example, the third semiconductor chips 320 may be substantially simultaneously stacked on the second semiconductor chips 220 using the head 106 whose floor surface is loaded with the third semiconductor chips 320. The third semiconductor chips 320 may be horizontally spaced apart from each other at substantially the same level.

When the third semiconductor chips 320 are stacked, the third semiconductor chips 320 may be compressed to form third adhesive layers as3 respectively on the first to third regions RG1, RG2 and RG3. The third semiconductor chips 320 may be compressed such that the third interconnect members 312 contact substantially an entire upper surface of a respective one of the second backside pads 232 of the second semiconductor chips 220. As an example, the second semiconductor chips 220 and the third semiconductor chips 320 may be electrically connected to each other. Thus, the sequentially stacked first to third semiconductor chips 120, 220 and 320 may be vertically connected to each other and may form a single stack structure SS. A plurality of stack structures SS may be formed respectively in the first to third regions RG1, RG2 and RG3.

The compression of the third semiconductor chips 320 may include performing a thermocompression. The compression of the third semiconductor chips 320 may be substantially the same as the compression of the first semiconductor chips 120.

Each of the third adhesive layers as3 may till a third space SP3 between the third semiconductor chip 320 and the second semiconductor chips 220. The third adhesive layer as3 may include a third sub-extension as3e covering sidewalls of the third semiconductor chip 320. The third sub-extension as3e may be a cured fillet that protrudes outside the third semiconductor chip 320 from the third non-conductive film when the third semiconductor chip 320 is compressed.

The sequentially stacked first to third adhesive layers as1, as2 and as3 may be integrally connected to each other to form a single adhesive structure AS. The adhesive structure AS may include an extension ASe covering sidewalls of the stack structure SS, and the extension ASe may include the first to third sub-extensions as1e, as2e and as3e.

Additional semiconductor chips may be stacked before the third semiconductor chips 320 are stacked. As an example, the stack structure SS according to an exemplary embodiment of the present inventive concept may include more than three stacked semiconductor chips. Alternatively, for example, the second semiconductor chips 220 may be omitted. As an example, the stack structure SS according to an exemplary embodiment of the present inventive concept may include two stacked semiconductor chips.

In a method for manufacturing a semiconductor device according to an exemplary embodiment of the present inventive concept of the present inventive concept, the non-conductive films 140 and 240 may be used to stack and bond the semiconductor chips 120, 220 and 320 on the package substrate 100, and thus it may be possible to achieve a relatively fine pitch between the interconnect members 112, 212 and 312 without an electrical short between the interconnect members 112, 212 and 312 adjacent to each other. The adhesive structure AS formed from the non-conductive films 140 and 240 may serve as an under-fill that substantially fills the first to third spaces SP1, SP2 and SP3, thus increasing mechanical endurance of the interconnect members 112, 212 and 312.

Figure 9:
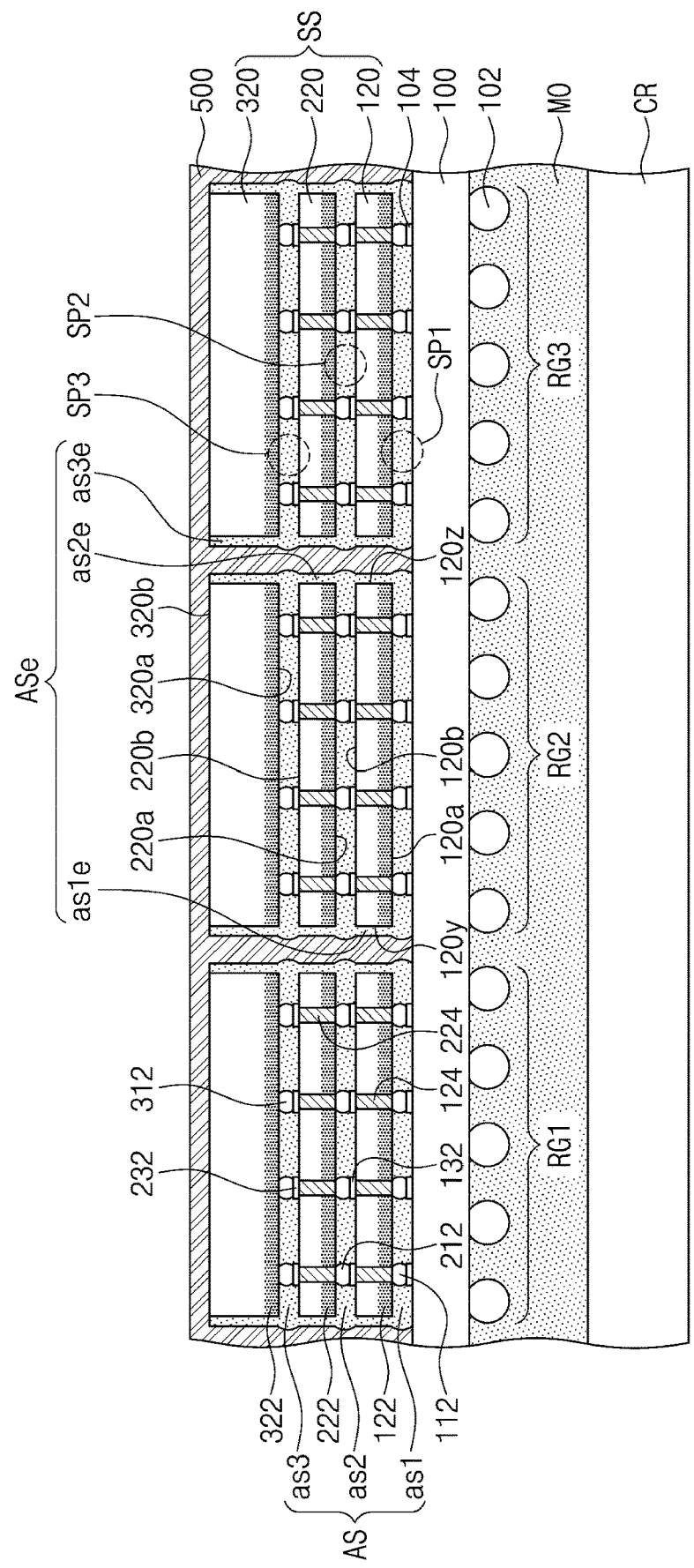

Referring to FIG. 9, a first molding layer 500 may be formed to cover the stack structures SS. Since the adhesive structure AS may serve as an under-fill that substantially fills the first to third spaces SP1, SP2 and SP3, the first molding layer 500 may be formed without performing a MUF (molded under-fill) process. For example, the first molding layer 500 may be formed to substantially completely cover the third inactive surfaces 320b of the third semiconductor chips 3230.

The first molding layer 500 may include a molding composition having a relatively low viscosity and a relatively high gap-fill property, and may thus substantially fill spaces between the stack structures SS. Thus, spaces between the structures SS that are irregular and relatively narrow, for example due to the extensions ASe of the adhesive structures AS, may be filled.

Figure 10:
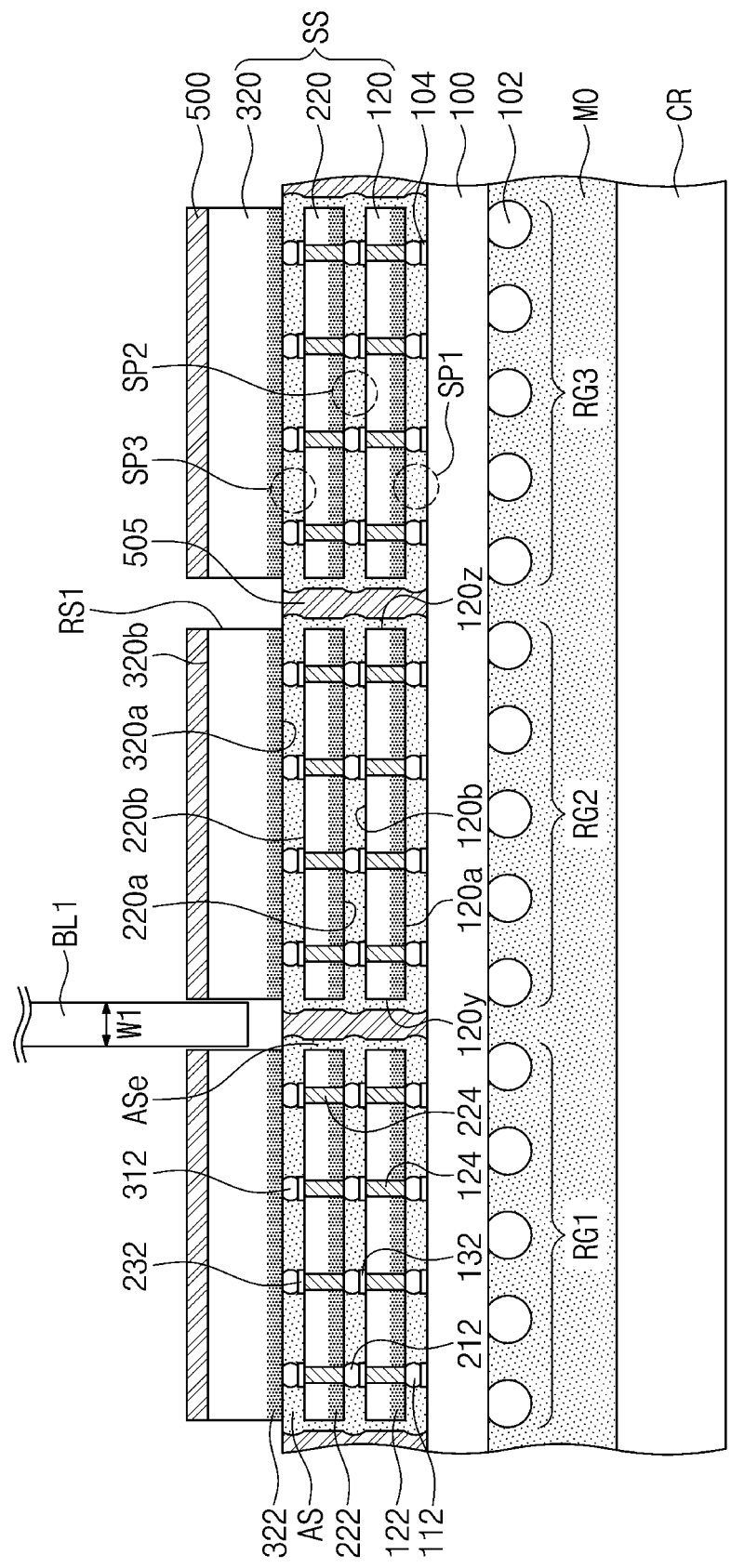

Referring to FIG. 10, the first molding layer 500 between the third semiconductor chips 320 may be cut to remove the extensions ASe disposed in spaces between the third semiconductor chips 320. As an example, a portion of each of the extensions ASe may be removed and the removed portion of the extension ASe may be the third sub-extension as3e.

As an example, a first blade BL1 may be used to cut between the third semiconductor chips 320. The first molding layer 500 between the third semiconductor chips 320 may be removed together with the extensions ASe between the third semiconductor chips 320. The first blade BL1 may have a first width W1. For example, the first width W1 may be substantially the same as a distance between the third semiconductor chips 320. The removal of the first molding layer 500 and the extensions ASe between the third semiconductor chips 320 may define first recess regions RS1 between the third semiconductor chips 320.

In an exemplary embodiment of the present inventive concept, the extensions ASe between the first semiconductor chips 120 and between the second semiconductor chips 220 need not be removed. In an exemplary embodiment of the present inventive concept, the cutting process may remove at least a portion of the extensions ASe between the first semiconductor chips 120 and between the second semiconductor chips 220. The remaining, not removed, first molding layer 500 may form first molding patterns 505 filling between the stack structures SS.

Figure 11:
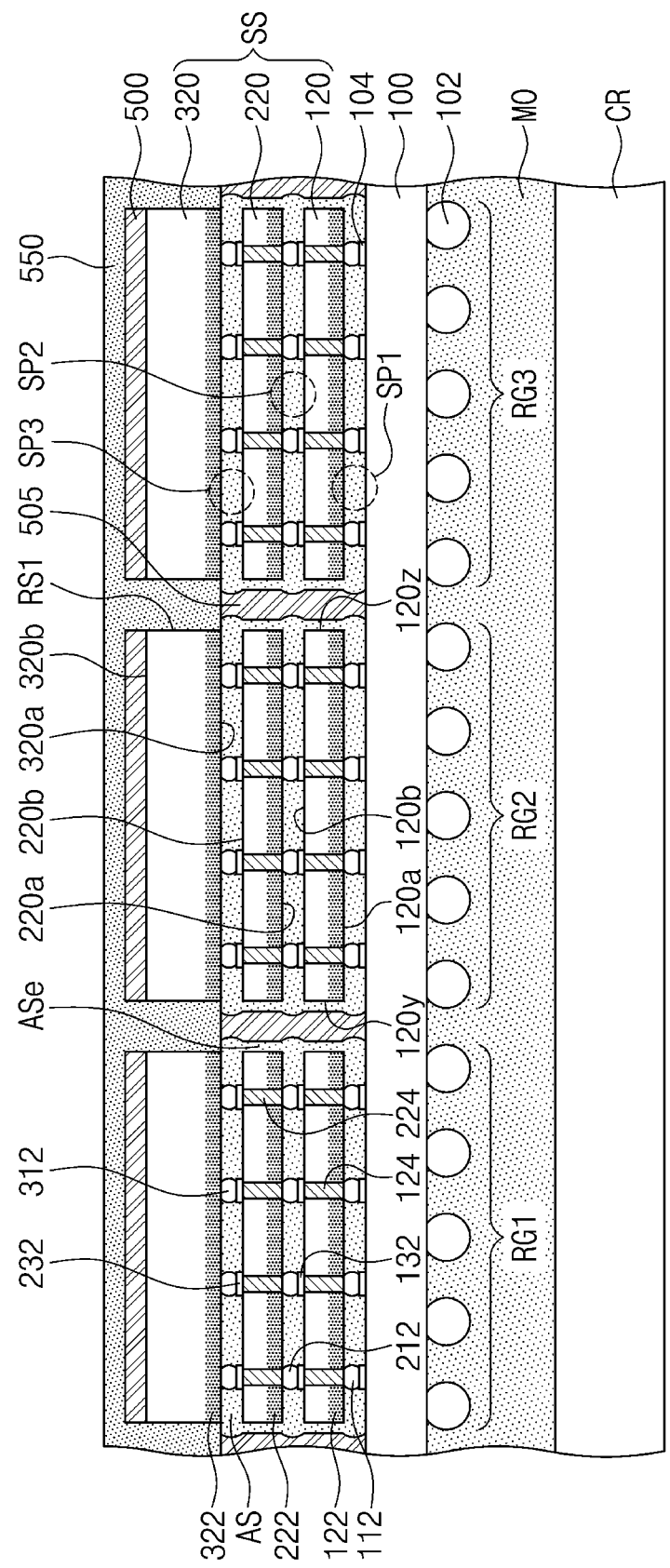

Referring to FIG. 11, a second molding layer 550 may be formed on the remaining first molding layer 500. The second molding layer 550 may fill the first recess regions RS1. For example, the second molding layer 550 may include a material different from that of the first molding layer 500. As an example, the second molding layer 550 may include an inorganic substance whose content is greater than that of the first molding layer 500 and may include an organic substance whose content is less than that of the first molding layer 500. Thus, the second molding layer 550 may have a thermal expansion coefficient less than that of the first molding layer 500. As an example, a molding composition of the second molding layer 550 may have a higher inorganic content than the first molding layer 500 such that the second molding layer 550 may have a relatively high viscosity and a relatively poor gap-fill property. However, the first recess regions RS1 may have a substantially uniformly shaped space and a relatively wide width such that the molding composition of the second molding layer 550 may fill the first recess regions RS1. As an example, the second molding layer 550 may include the same material as the first molding layer 500; however, exemplary embodiments of the present inventive concept are not limited thereto.

Figure 12:
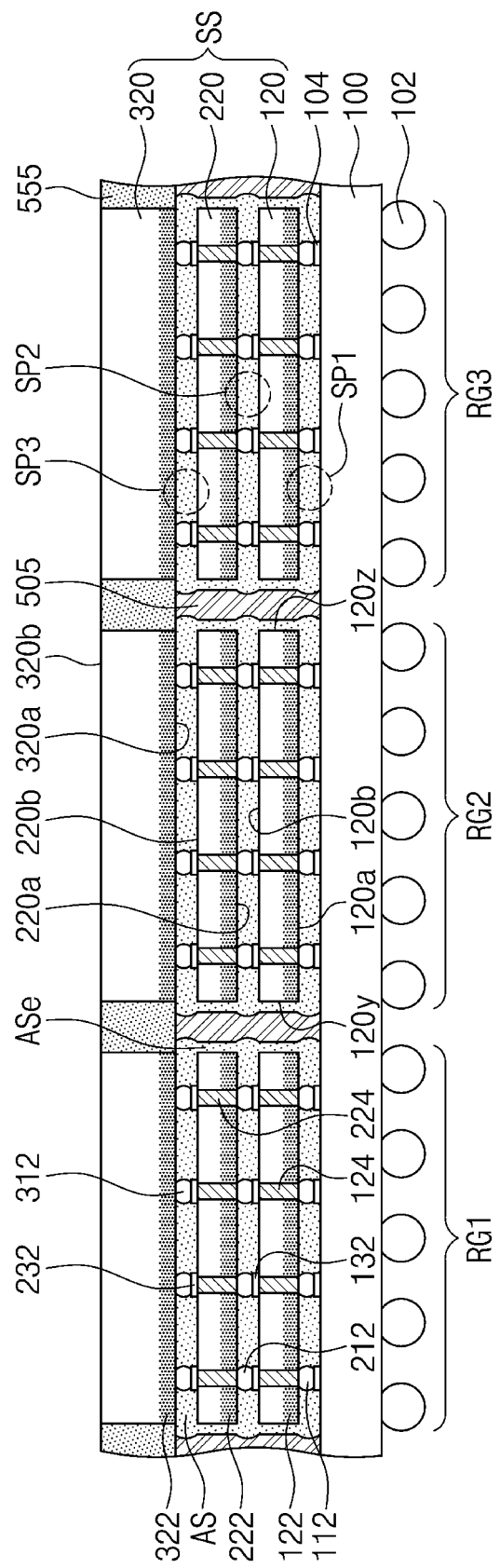

Referring to FIG. 12, the second molding layer 550 and the first molding layer 500 may be planarized until exposing the third inactive surfaces 320b of the third semiconductor chips 320 and thus second molding patterns 555 may be formed. The second molding patterns 555 may respectively substantially fill the second regions RS2. The first molding layer 500 may be substantially completely removed from on the third semiconductor chips 320.

Through the planarization process, the third inactive surfaces 320b of the third semiconductor chips 320 may be substantially aligned with top surfaces of the second molding patterns 555. When the third inactive surfaces 320b are exposed to an outside of the first to third semiconductor chips 120, 220 and 320, heat may be removed from the first to third semiconductor chips 120, 220 and 320.

The carrier substrate CR may be detached from the package substrate 100 by removing the adhesive mold MO from between the carrier substrate CR and the package substrate 100.

Figure 13:
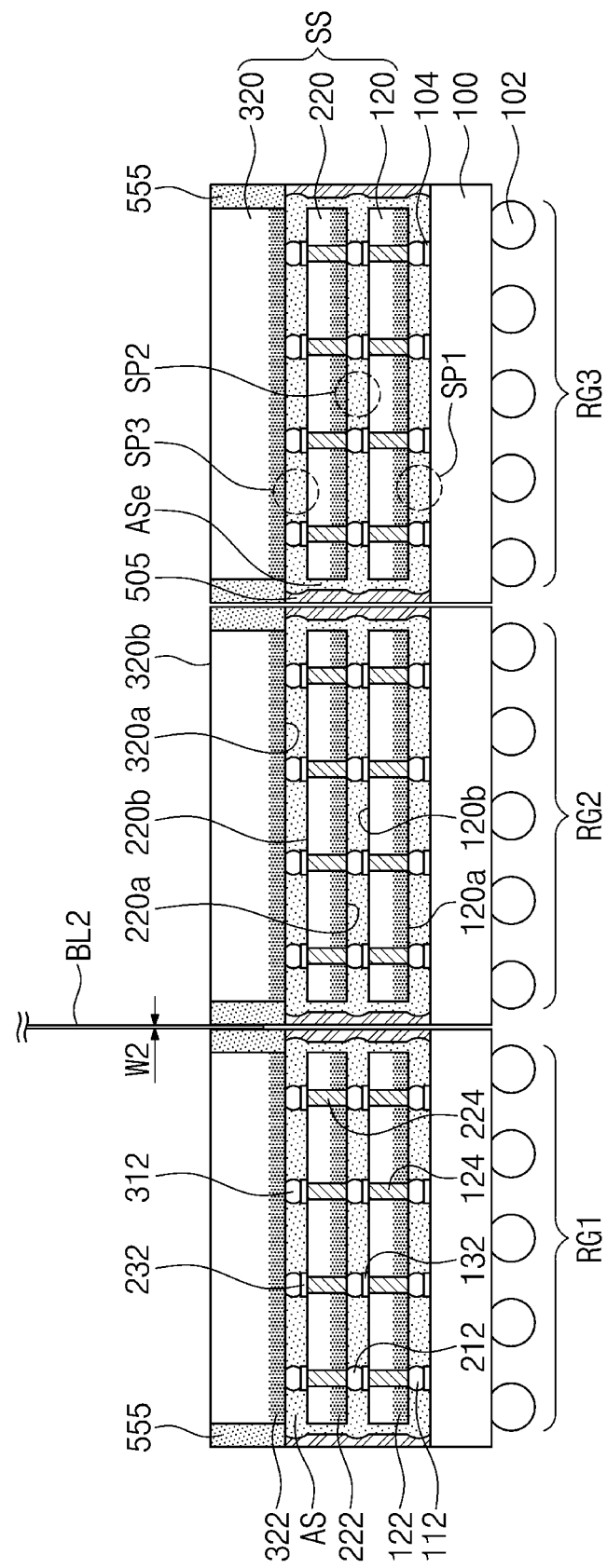

Referring to FIG. 13, a cutting process may be performed on the package substrate 100 to form a plurality of semiconductor packages. As an example, a second blade BL2 may be used to cut between the first to third regions RG1, RG2 and RG3 of the package substrate 100. The first to third regions RG1, RG2 and RG3 may thus be separated from each other. The cutting process may cut the first and second molding patterns 505 and 555 between the stack structures SS. A single semiconductor package may be formed including the stack structure SS on one of the first to third regions RG1, RG3 and RG3 through the cutting process. The second blade BL2 may have a second width W2. The second width W2 may be less than the first width W1.

Figure 14:
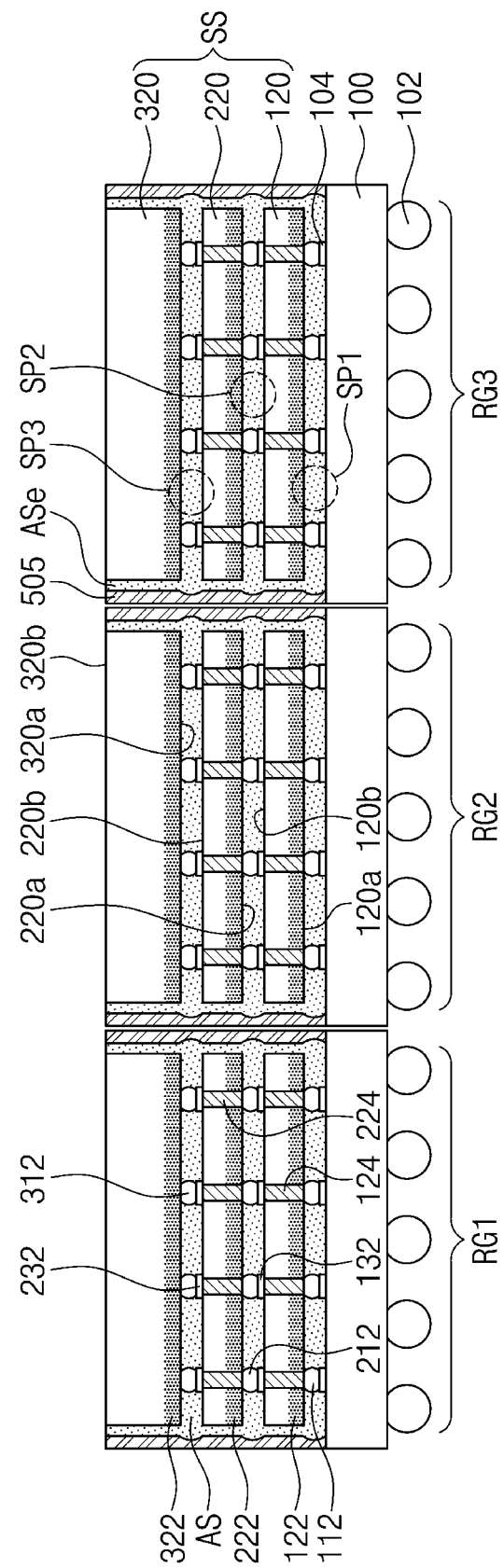
FIG. 14 is a cross-sectional view illustrating a method for manufacturing a semiconductor device according to a comparative example.
Figure 15:
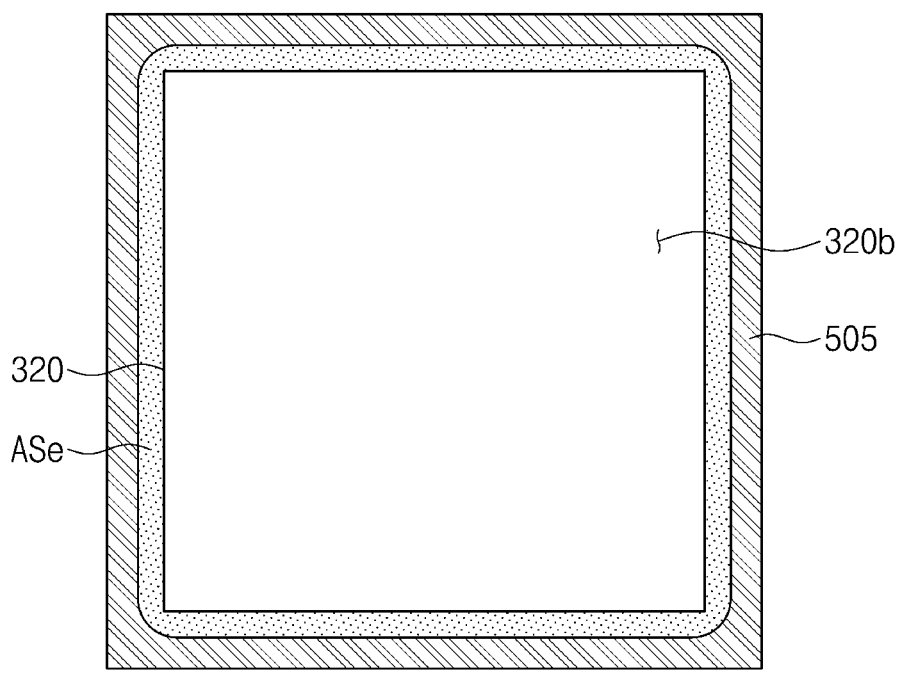
FIG. 15 is a plan view illustrating a top surface of a semiconductor package depicted in FIG. 14.

FIG. 14 is a cross-sectional view illustrating a method for manufacturing a semiconductor device according to a comparative example. FIG. 15 is a plan view illustrating a top surface of the semiconductor package of FIG. 14.

In a method of manufacturing a semiconductor device, the extensions ASe might not be removed from between the third semiconductor chips 320. The stack structure SS may be covered only with the first molding pattern 505. The extension ASe of the adhesive structure AS may be disposed between the third semiconductor chip 320 and the first molding pattern 505. The extension ASe may have a top surface that is substantially aligned with the third inactive surface 320b of the third semiconductor chip 320. As an example, the top surface of the extension ASe may be externally exposed between the third semiconductor chip 320 and the first molding pattern 505. The exposed extension ASe may display an irregular shape on a top surface of the semiconductor package.

In a method for manufacturing a semiconductor device according to an exemplary embodiment of the present inventive concept, the adhesive structure AS may have no externally exposed extension ASe and may not display an irregular shape on a top surface of the semiconductor package. Upper and lower portions of the semiconductor package may include the first and second molding patterns 505 and 555, respectively, whose materials may be different from each other. As an example, the second molding pattern 555 may have a relatively low thermal expansion coefficient, and thus it may be possible to reduce or eliminate heat-induced warpage of the semiconductor package.

A semiconductor device according to an exemplary embodiment of the present inventive concept will be described in more detail below with reference to FIG. 13.

Referring to FIG. 13, the stack structure SS may be disposed on the package substrate 100. For example, the package substrate 100 may be a printed circuit board (PCB). The package substrate 100 may have a bottom surface including outer interconnect members 102 such as solder balls and a top surface including landing pads 104. The package substrate 100 may include at least one through via.

The stack structure SS may include first to third semiconductor chips 120, 220 and 230 that may be sequentially stacked. The first semiconductor chip 120 may include first through vias 124 electrically connected to a first circuit layer 122, and the second semiconductor chip 220 may include second through vias 224 electrically connected to a second circuit layer 222. The third semiconductor chip 320 might not include through vias; however, exemplary embodiments of the present inventive concept are not limited thereto. In an exemplary embodiment of the present inventive concept, the first to third semiconductor chips 120, 220 and 120 may each be memory chips.

As an example, the first to third semiconductor chips 120, 220 and 320 may have substantially the same planar shape and size as each other. The third semiconductor chip 320 may have a greater thickness than the first and second semiconductor chips 120 and 220; however, exemplary embodiments of the present inventive concept are not limited thereto.

First interconnect members 112 such as solder balls or solder bumps may be disposed on the first active surface 120a of the first semiconductor chip 120. The first semiconductor chip 120 may be electrically connected to the package substrate 100 through the first interconnect members 112. The first semiconductor chip 120 may include first backside pads 132 disposed on the first inactive surface 120b of the first semiconductor chip 120. The first backside pads 132 may be electrically connected to the first through vias 124.

Second interconnect members 212 such as solder balls or solder bumps may be disposed on the second active surface 220a of the second semiconductor chip 220. The second semiconductor chip 220 may be electrically connected to the first semiconductor chip 120 through the second interconnect members 212. The second semiconductor chip 220 may include second backside pads 232 disposed on the second inactive surface 220b of the second semiconductor chip 220. The second backside pads 232 may be electrically connected to the second through vias 224.

Third interconnect members 312 such as solder balls or solder bumps may be disposed on a third active surface 320a of the third semiconductor chip 320. The third semiconductor chip 320 may be electrically connected to the second semiconductor chip 220 through the third interconnect members 312. Thus, the package substrate 100 and the first to third semiconductor chips 120, 220 and 320 may be vertically and electrically connected to each other.

An adhesive structure AS may fill the first space SP1 between the package substrate 100 and the first semiconductor chip 120, the second space SP2 between the first and second semiconductor chips 120 and 220, and the third space SP3 between the second and third semiconductor chips 220 and 320. The adhesive structure AS may bond the first to third semiconductor chips 120, 220 and 320 to the package substrate 100. The adhesive structure AS may fill between the first to third interconnect members 112, 212 and 312 adjacent to each other such that the first to third interconnect members 112, 212 and 312 may be insulated from each other.

The adhesive structure AS may include the extension ASe covering sidewalls of the first and second semiconductor chips 120 and 220. A portion of the adhesive structure AS may be the extension ASe protruding outward from outer sides of the first and second semiconductor chips 120 and 220. The extension ASe may cover only the sidewalk of the first semiconductor chip 120; however, exemplary embodiments of the present inventive concept are not limited thereto.

The package substrate 100 may include the first molding pattern 505 and the second molding pattern 555 covering the stack structures SS. The second molding pattern 555 may be disposed on the first molding pattern 505 and may cover sidewalls of the third semiconductor chip 320. The first molding pattern 505 may cover sidewalls of the extension ASe. For example, the second molding pattern 555 may have a thermal expansion coefficient less than that of the first molding pattern 505. Thus, the second molding pattern 555 may reduce or eliminate heat-induced warpage of the semiconductor package.

The second molding pattern 555 may have a top surface that is substantially aligned with the third inactive surface 320b of the third semiconductor chip 320. The third inactive surface 320b of the third semiconductor chip 320 may thus be exposed to an outside of the first to third semiconductor chips 120, 220 and 320. Thus, it may be possible to remove heat generated from the first to third semiconductor chips 120, 220 and 320.

FIGS. 16 to 19 are cross-sectional views illustrating a method for manufacturing a semiconductor device according to some exemplary embodiments of the present inventive concept. Technical features described below with reference to FIGS. 16 to 19 may be substantially the same as those discussed above with reference to FIGS. 1 to 13, and thus duplicative descriptions may be omitted.

Figure 16:
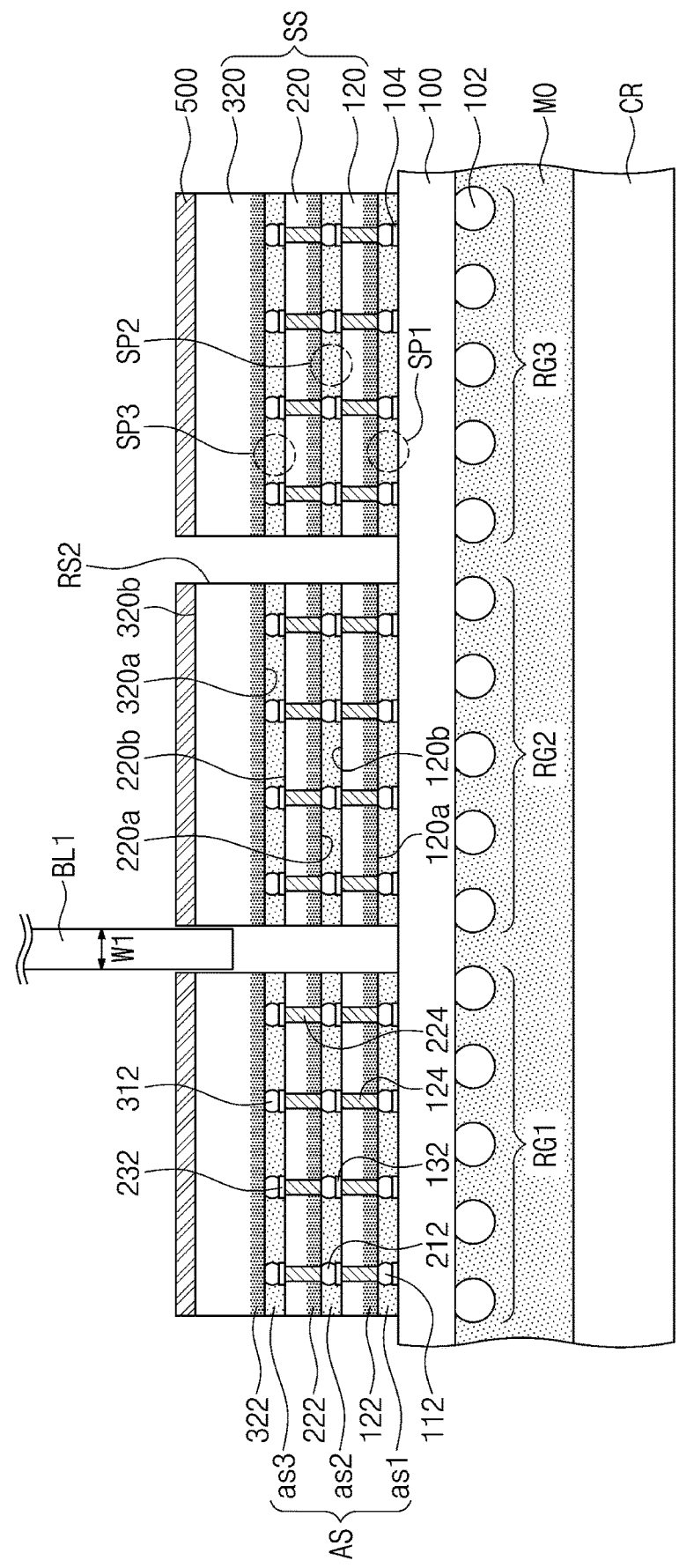
FIGS. 16 to 19 are cross-sectional views illustrating a method for manufacturing a semiconductor device according to some exemplary embodiments of the present inventive concept.

Referring to FIG. 16, a cutting process may be carried out on a resultant structure (e.g., the resultant structure described with reference to FIG. 9) to remove the extensions ASe disposed in spaces between the stack structures SS. As an example, the first blade BL1 may be used to cut between the stack structures SS. The cutting process may be performed until partially exposing the top surface of the package substrate 100. The extensions ASe may thus be substantially completely removed from between the stack structures SS. Alternatively, at least one of the first molding layer 500 and the extension ASe may partially remain between the stack structures SS; however, exemplary embodiments of the present inventive concept are not limited thereto.

As the cutting process removes the first molding layer 500 and the extensions ASe between the stack structures SS, second recess regions RS2 may be defined. When the cutting process is terminated, the first to third adhesive layers as1, as2 and as3 of the adhesive structure AS may be separated and vertically spaced apart from each other.

Figure 17:
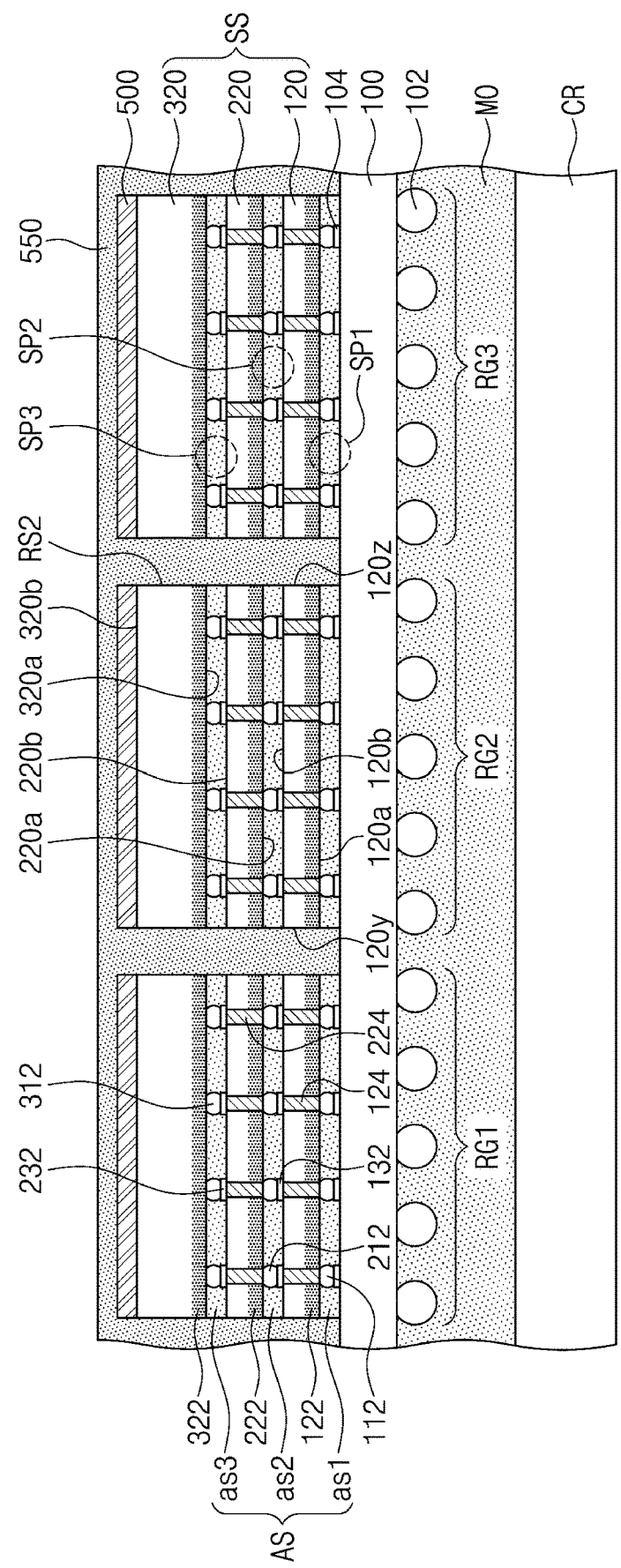

Referring to FIG. 17, the second molding layer 550 may be formed to cover the stack structures SS. The second molding layer 550 may be formed to fill the second recess regions RS2. The second recess regions RS2 may have a substantially uniform shape and a relatively wide width such that the molding composition of the second molding layer 550 may fill the second recess regions RS2.

Figure 18:
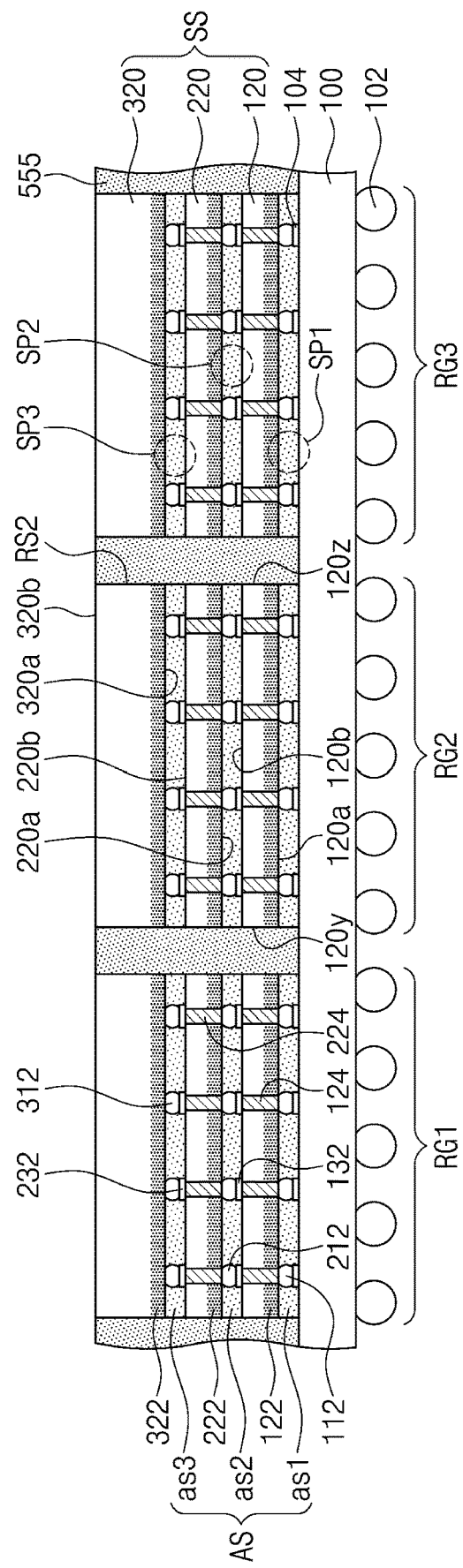

Referring to FIG. 18, the second molding layer 550 and the first molding layer 500 may be planarized until exposing the third inactive surfaces 320b of the third semiconductor chips 320 and thus second molding patterns 555 may be formed. The carrier substrate CR may be detached from the package substrate 100 by removing the adhesive mold MO from between the carrier substrate CR and the package substrate 100.

Figure 19:
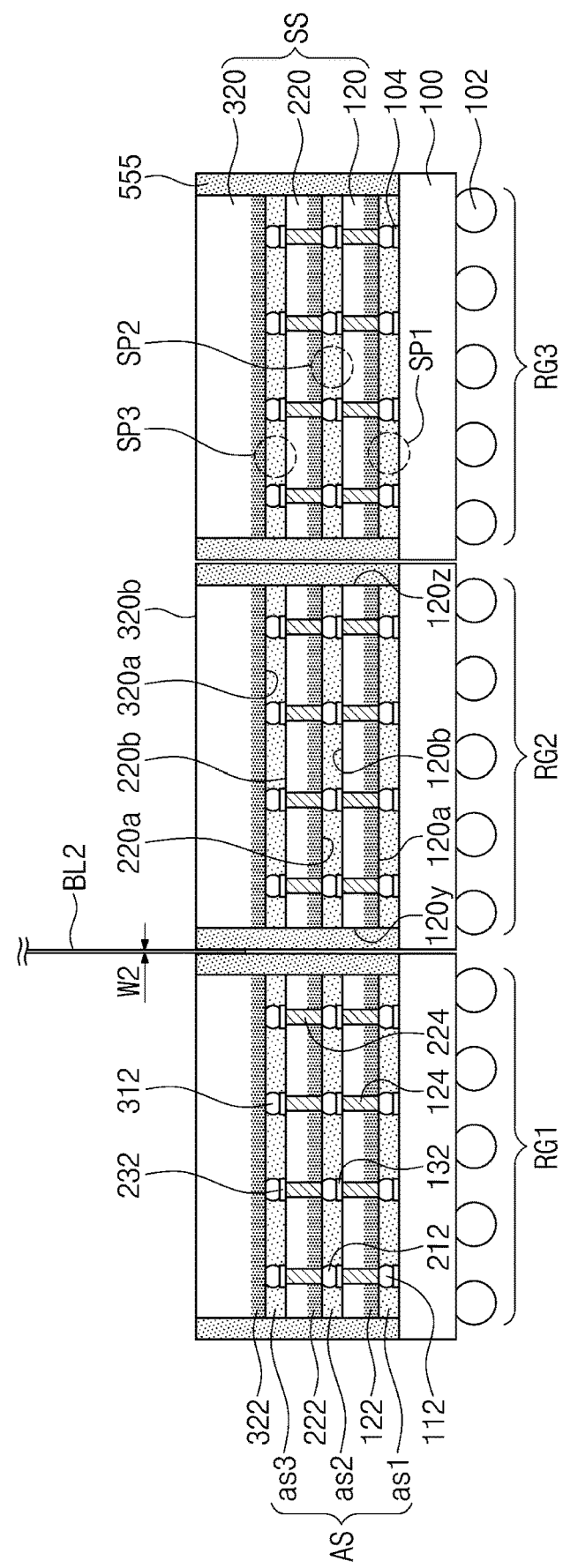

Referring to FIG. 19, a cutting process may be performed on the package substrate 100 to form a plurality of semiconductor packages. The cutting process may be performed using the second blade BL2.

According to an exemplary embodiment of the present inventive concept, it may be possible to substantially completely remove the extension ASe of the adhesive structure AS. Thus, the adhesive structure AS may have no externally exposed extension ASe and may not display an irregular shape on a top surface of the semiconductor package. The second molding pattern 555 may have a relatively low thermal expansion coefficient, and thus it may be possible to reduce or eliminate beat-induced warpage of the semiconductor package.

A semiconductor device according to an exemplary embodiment of the present inventive concept will be described in more detail below with reference to FIG. 19. Technical features described below with reference to FIG. 19 may be substantially the same as those discussed above with reference to FIG. 13, and thus duplicative descriptions may be omitted.

Referring to FIG. 19, the adhesive structure AS may include the first to third adhesive layers as1, as2 and as3. The first to third adhesive layers as1, as2 and as3 may respectively substantially fill the first to third spaces SP1, SP2 and SP3. The first to third adhesive layers as1, as2 and as3 may be separated and vertically spaced apart from each other.

The package substrate 100 may include the second molding pattern 555 covering the stack structures SS. For example, the second molding pattern 555 may be in direct contact with sidewalls of the first to third semiconductor chips 120, 220 and 320. The second molding pattern 555 may be in direct contact with sidewalls of the first to third adhesive layers as1, as2 and as3.

Figure 20:
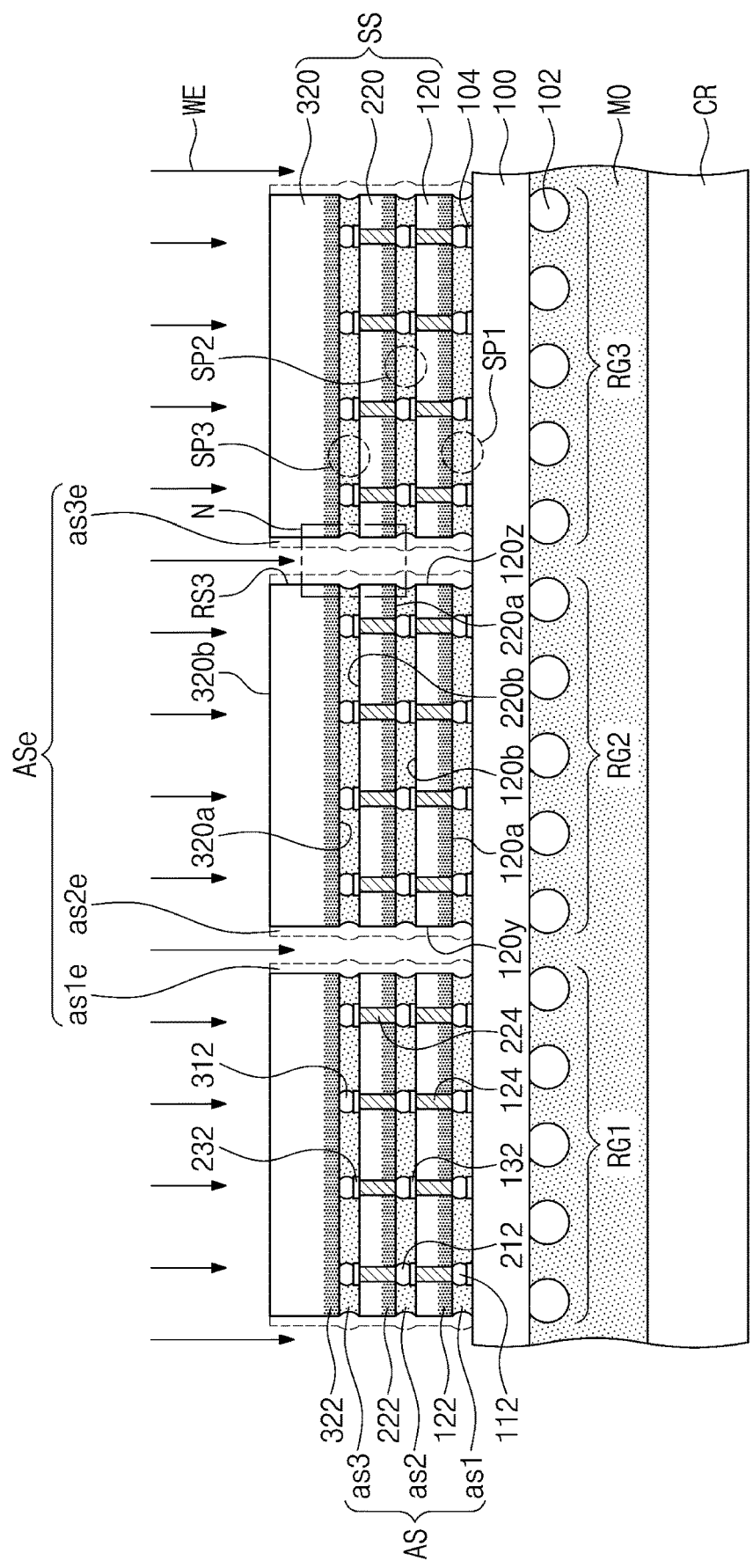
FIGS. 20, 23 and 24 are cross-sectional views illustrating a method for manufacturing a semiconductor device according to some exemplary embodiments of the present inventive concept.
Figure 21:
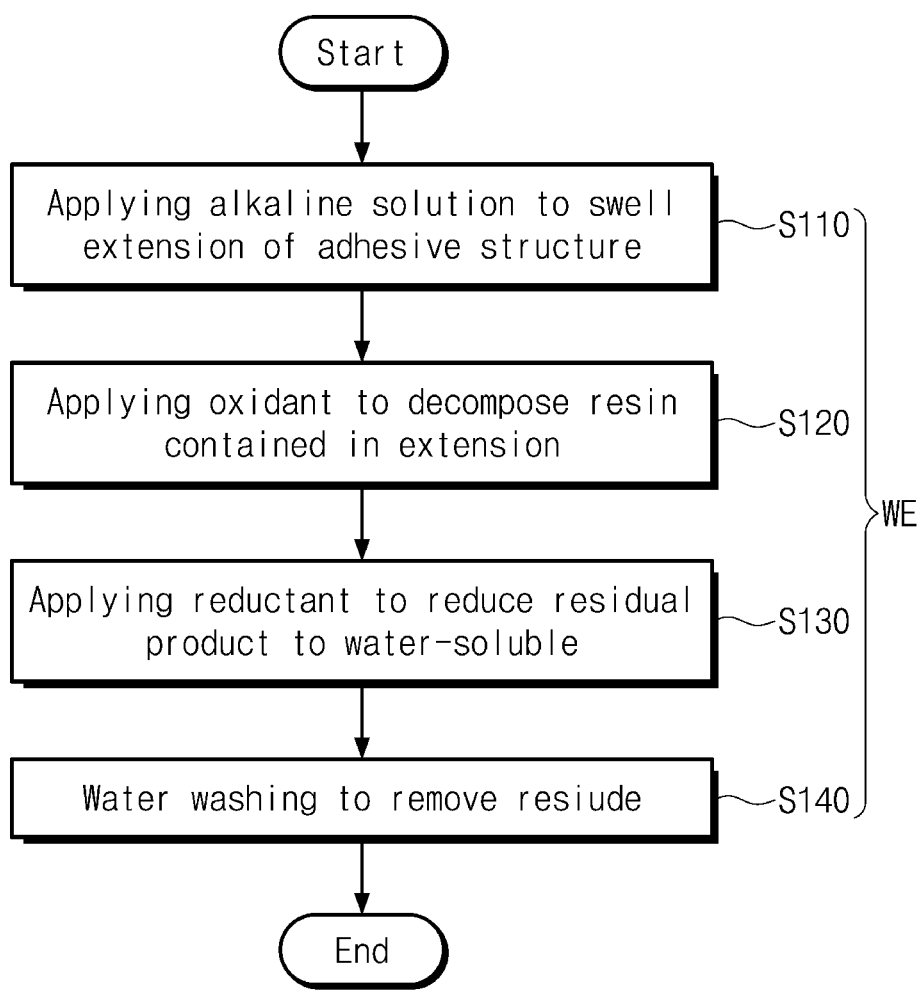
FIG. 21 is a flow chart illustrating a wet etch process according to some exemplary embodiments of the present inventive concept.
Figure 22A:
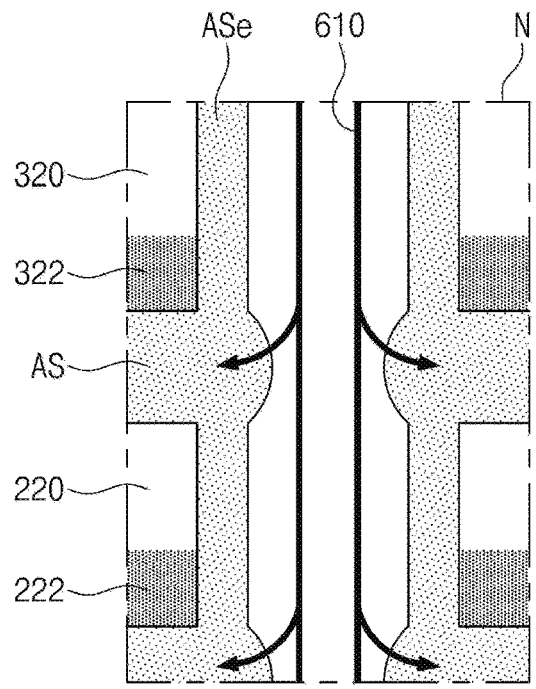
FIGS. 22A to 22D are enlarged cross-sectional views of section N of FIG. 20.
Figure 22B:
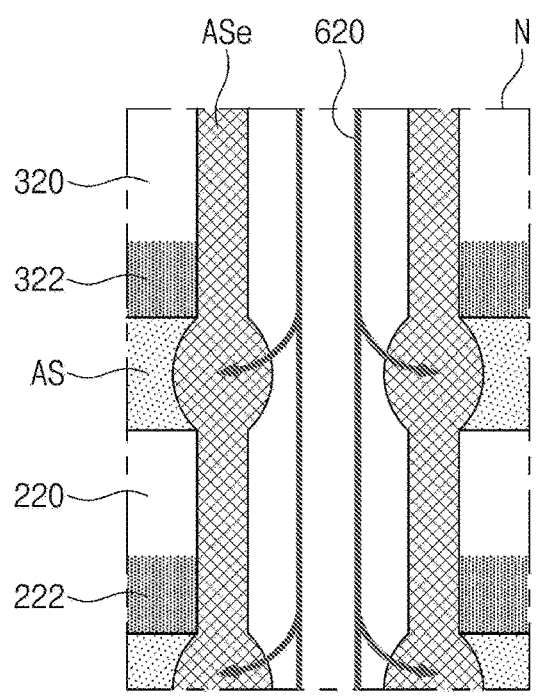
Figure 22C:
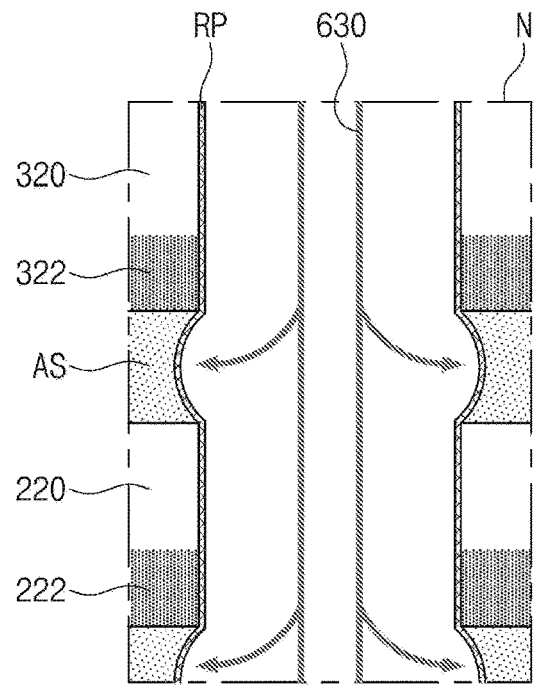
Figure 22D:
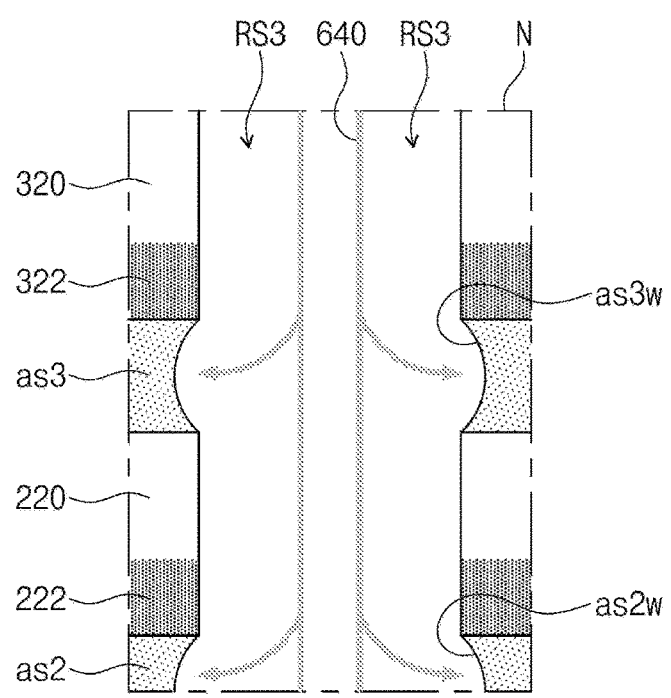
Figure 23:
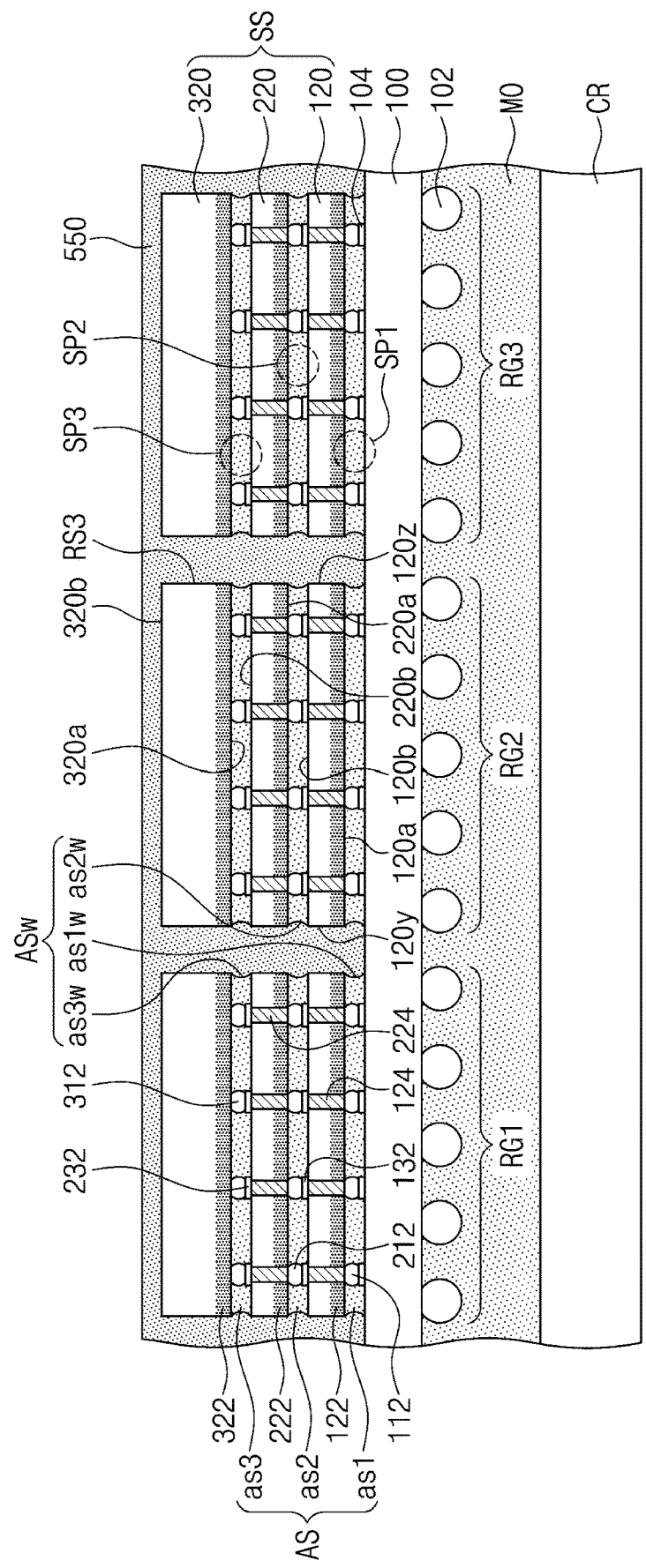
Figure 24:
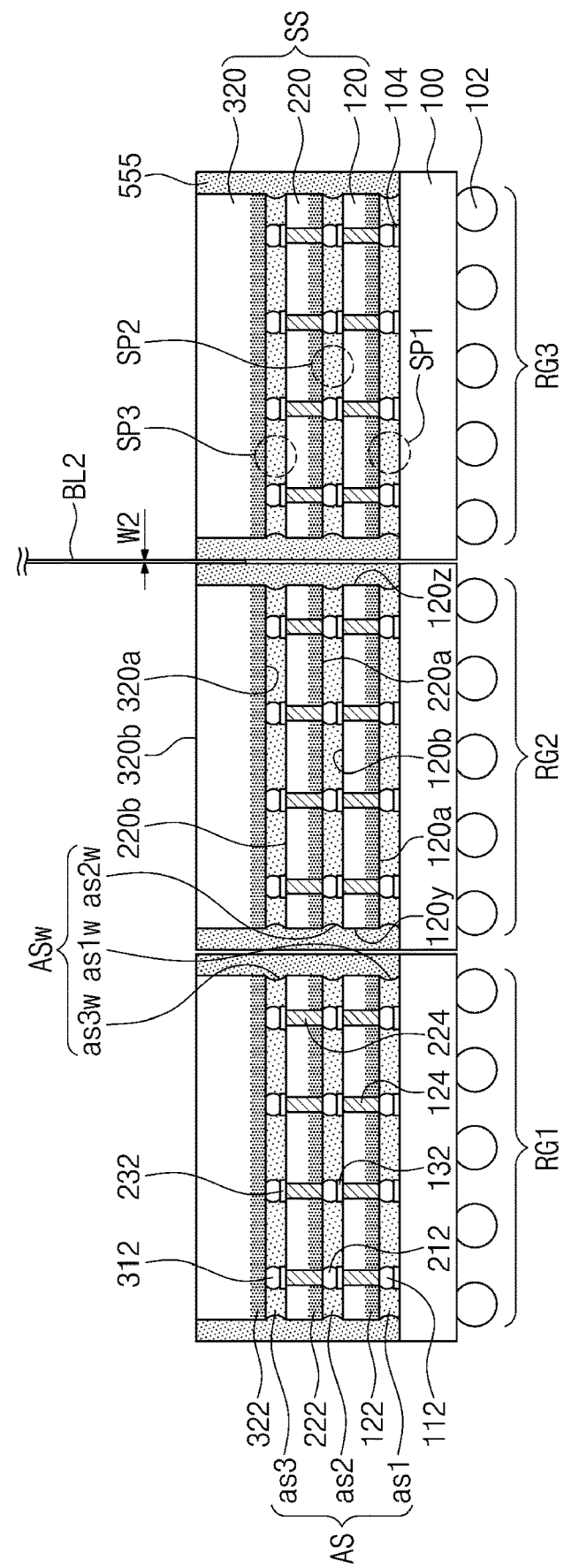

FIGS. 20, 23 and 24 are cross-sectional views illustrating a method for manufacturing a semiconductor device according to some exemplary embodiments of the present inventive concept. FIG. 21 is a flow chart illustrating a wet etch process according to some exemplary embodiments of the present inventive concept. FIGS. 22A to 22D are enlarged cross-sectional views of section N of FIG. 20. Technical features described below with reference to FIGS. 20, 21, 22A, 22B, 22C, 22D, 23 and 24 may be substantially the same as those discussed above with reference to FIGS. 1 to 13, and thus duplicative descriptions may be omitted.

Referring to FIG. 20, a wet etch process WE process may be carried out on a resultant structure (e.g., the resultant structure described with reference to FIG. 8) to remove the extensions ASe disposed in spaces between the stack structures SS. As an example, the wet etch process WE may include introducing an etch solution into spaces between the stack structures SS to selectively wet etch the extensions ASe. The extensions ASe may thus be substantially completely removed from between the stack structures SS. Alternatively, the extensions ASe may partially remain between the stack structures SS; however, exemplary embodiments of the present inventive concept are not limited thereto. As an example, the first molding layer 500 need not be formed.

Referring to FIGS. 20, 21 and 22A, the wet etch process WE may include applying alkaline solution to swell an extension of an adhesive structure (S110). For example, the wet etching process WE may include applying an alkaline solution 610 onto the extension ASe between the stack structures SS. The alkaline solution 610 may be applied onto the extension ASe through a space between the stack structures SS. The alkaline solution 610 may swell a resin included in the extension ASe. For example, the alkaline solution 610 may include a sodium hydroxide solution.

Referring to FIGS. 20, 21 and 22B, the wet etch process WE may include applying an oxidant to decompose resin contained in an extension (S120). For example, the wet etch process WE may include applying an oxidant 620 onto the extension ASe between the stack structures SS. The oxidant 620 may effectively decompose the swollen resin included in the extension ASe. For example, the oxidant 620 may include potassium permanganate. As an example, the extension ASe may be decomposed based on an etch principle given by Reaction 1 below.

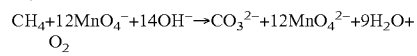

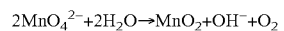    [Reaction 1]

Referring to FIGS. 20, 21 and 22C, the wet etch process WE may include applying reductant to reduce a residual product to water-soluble (S130). The wet etch process may include applying a reductant 630 onto a residual product RP remaining between the stack structures SS. After the oxidant 620 decomposes the resin included in the extension ASe, there may remain the residual product 620 including an unreacted oxidant 620. Thus, the reductant 630 may be applied to reduce the residual product RP to water-soluble. For example, the reductant 630 may include hydrogen peroxide and/or hydroxylamine, and the residual product RP may include manganese oxide. As an example, the residual product RP may be reduced to water-soluble based on a reduction principle expressed by Reaction 2 below.

$MnO_2 + 4H^+ + 2e^- \rightarrow Mn^{2+} + 2H_2O$ $H_2O_2 \rightarrow 2H^+ + 2e^- + O_2$ $2NH_2OH \rightarrow 4H^+ + 2H_2O + 2e^- + N_2$                [Reaction 2]

Referring to FIGS. 20, 21 and 22D, the wet etch process WE may include water washing to remove a residue (S140). The wet etch process may include performing a water washing 640 to remove a residue between the stack structures SS. Since the residual product RP is reduced to water-soluble in the previous process, the water washing 640 may substantially completely remove the residue. Thus, the extension ASe may be substantially completely removed and the first to third adhesive layers as1, as2 and as3 of the adhesive structure AS may be separated and vertically spaced apart from each other. Since the extension ASe may be removed by the wet etch process WE or an isotropic etch process, a recessed sidewall may be formed on at least one of the first to third adhesive layers as1, as2 and as3. For example, a third recessed sidewall as3w may be formed on the third adhesive layer as3. Since the wet etch process WE may be performed to remove the extensions ASe between the stack structures SS, third recess regions RS3 may be defined.

Referring to FIG. 23, the second molding layer 550 may be formed to cover the stack structures SS. The second molding layer 550 may be formed to fill the third recess regions RS3. The third recess regions RS3 may have a substantially uniform shape and a relatively wide width such that the molding composition of the second molding layer 550 may fill the third recess regions RS3.

Referring to FIG. 24, the second molding layer 550 may be planarized until exposing the third inactive surfaces 320b of the third semiconductor chips 320 and thus second molding patterns 555 may be formed. The carrier substrate CR may be detached from the package substrate 100 by removing the adhesive mold MO from between the carrier substrate CR and the package substrate 100. A cutting process may be performed on the package substrate 100 to form a plurality of semiconductor packages. The cutting process may be performed using a second blade BL2.

According to an exemplary embodiment of the present inventive concept, it may be possible to substantially completely remove the extension ASe of the adhesive structure AS that may be exposed to an outside. Thus, the adhesive structure AS may have no externally exposed extension ASe and may not display an irregular shape on a top surface of the semiconductor package. It may also be possible to simplify removing the extension ASe of the adhesive structure AS because there is no need to form the first molding layer 500. The second molding pattern 555 may have a relatively low thermal expansion coefficient, and thus it may be possible to reduce or eliminate heat-induced warpage of the semiconductor package.

A semiconductor device according to an exemplary embodiment of the present inventive concept will be described in more detail below with reference to FIG. 24. Technical features described with reference to FIG. 24 may be substantially the same as technical features described with reference to FIG. 13, and thus duplicative descriptions may be omitted.

Referring back to FIG. 24, the adhesive structure AS may include the first to third adhesive layers as1, as2 and as3. The first to third adhesive layers as1, as2 and as3 may respectively substantially fill the first to third spaces SP1, SP2 and SP3. The first to third adhesive layers as1, as2 and as3 may be separated and vertically spaced apart from each other.

The first to third adhesive layers as1, as2 and as3 may respectively include first to third recessed sidewalls as1w, as2w and as3w. The first to third recessed sidewalls as1w, as2w and as3w may form a recessed sidewall ASw of the adhesive structure AS. The first to third recessed sidewalls as1w, as2w and as3w may be recessed toward the interconnect members 112, 212 and 312, respectively.

The package substrate 100 may include a second molding pattern 555 covering the stack structures SS. For example, the second molding pattern 555 may be in direct contact with sidewalls of the first to third semiconductor chips 120, 220 and 320. The second molding pattern 555 may be in direct contact with the first to third recessed sidewalls as1w, as2w and as3w. The second molding pattern 555 and the adhesive structure AS may include different materials from each other. For example, the second molding pattern 555 may have a thermal expansion coefficient different from that of the adhesive structure AS.

In a method for manufacturing a semiconductor device according to an exemplary embodiment of the present inventive concept, it may be possible to effectively remove the extension of the adhesive structure covering the semiconductor chips, which need not spoil the appearance of the semiconductor package. The molding layer may have a relatively low thermal expansion coefficient and thus warpage of the semiconductor package may be reduced or eliminated.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:
1. A semiconductor device, comprising:
semiconductor chips stacked on a package substrate;
a through via penetrating at least one of the semiconductor chips and electrically connecting the semiconductor chips to each other;
a first molding layer covering a sidewall of an uppermost one of the semiconductor chips;
an adhesive layer covering sidewalls of the semiconductor chips except for the uppermost one of the semiconductor chips, wherein a side surface of the adhesive layer includes a plurality of protrusions; and
a second molding layer covering the side surface of the adhesive layer and a bottom surface of the first molding layer.
2. The semiconductor device of claim 1, wherein the adhesive layer fills a space between the semiconductor chips adjacent to each other.

3. The semiconductor device of claim 1, further comprising an interconnect member interposed between the semiconductor chips adjacent to each other and electrically connected to the through via.

4. The semiconductor device of claim 1, wherein the adhesive layer is spaced apart from the sidewall of the uppermost one of the semiconductor chips.

5. The semiconductor device of claim 1, wherein the adhesive layer covers a bottom surface of the uppermost one of the semiconductor chips.

6. The semiconductor device of claim 1, wherein a top surface of the uppermost one of the semiconductor chips is coplanar with a top surface of the first molding layer.

7. A semiconductor device, comprising:
    semiconductor chips stacked on a package substrate, the semiconductor chips including a first semiconductor chip that is a lowermost one of the semiconductor chips and a second semiconductor chip that is an uppermost one of the semiconductor chips;
    a through via penetrating the first semiconductor chip;
    an adhesive layer filling a space between the first semiconductor chip and the package substrate, and covering a sidewall of the first semiconductor chip and a bottom surface of the second semiconductor chip; and
    a first molding layer covering a sidewall of only the second semiconductor chip of the semiconductor chips.

8. The semiconductor device of claim 7, further comprising an interconnect member interposed between the first semiconductor chip and the package substrate, and electrically connected to the through via.

9. The semiconductor device of claim 7, wherein the adhesive layer is spaced apart from the sidewall of the second semiconductor chip.

10. The semiconductor device of claim 7, further comprising a second molding layer covering a side surface of the adhesive layer and a bottom surface of the first molding layer.

11. The semiconductor device of claim 10, wherein the side surface of the adhesive layer includes a plurality of protrusions.

12. The semiconductor device of claim 7, wherein a top surface of the second semiconductor chip is coplanar with a top surface of the first molding layer.

13. A semiconductor device, comprising:
    a plurality of semiconductor chips stacked on a package substrate, the semiconductor chips including a first semiconductor chip that is a lowermost one of the semiconductor chips, a second semiconductor chip that is an uppermost one of the semiconductor chips and a third semiconductor chip between the first and second semiconductor chips;
    a through via penetrating the third semiconductor chip;
    a first molding layer on sidewalls of the first and third semiconductor chips; and
    a second molding layer on the first mold layer,
    wherein the second molding layer covers a sidewall of the second semiconductor chip, and
    wherein the first molding layer is spaced apart from the sidewall of the second semiconductor chip.

14. The semiconductor device of claim 13, wherein a top surface of the first molding layer is at a level between a top surface of the third semiconductor chip and a bottom surface of the second semiconductor chip.

15. The semiconductor device of claim 13, further comprising an interconnect member interposed between the first and third semiconductor chips and electrically connected to the through via.

16. The semiconductor device of claim 13, wherein a top surface of the second semiconductor chip is coplanar with a top surface of the second molding layer.

17. The semiconductor device of claim 13, wherein the second molding layer includes a material different from that of the first molding layer.

* * * * *